United States Patent [19]

Takahashi et al.

[11] 4,263,708
[45] Apr. 28, 1981

[54] MACHINE FOR AUTOMATICALLY INSERTING PARALLEL LEAD ELECTRONIC COMPONENTS INTO A PRINTED CIRCUIT BOARD

[75] Inventors: Tetsuo Takahashi; Yoshinobu Taguchi; Kotaro Harigane, all of Tokyo, Japan

[73] Assignee: Tokyo Denki Kagaku Kogyo Kabushiki Kaisha, Japan

[21] Appl. No.: 43,750

[22] Filed: May 30, 1979

[30] Foreign Application Priority Data

Jun. 3, 1978 [JP] Japan .................................. 53/67146
Oct. 9, 1978 [JP] Japan ................................ 53/124465

[51] Int. Cl.³ ............................................. H05K 3/30
[52] U.S. Cl. ................................ 29/564.1; 29/564.6; 29/741
[58] Field of Search ..................... 29/564.1, 564.6, 749, 29/741, 33 M

[56] References Cited

U.S. PATENT DOCUMENTS 4,054,988  10/1977  Masuzima .......................... 29/564.6

Primary Examiner—William R. Briggs
Attorney, Agent, or Firm—Steinberg & Raskin

[57] ABSTRACT

A machine for processing and inserting parallel lead electronic components from electronic component web carriers into lead receiving openings in a printed circuit board has improved supply apparatus for selectively receiving an electronic component at a first position and supplying the electronic component to a second predetermined position. The supply apparatus includes a supply sub-assembly having electronic component web carrier apparatus for supporting a plurality of electronic component web carriers at predetermined intervals. Each electronic component web carrier supported by the electronic component web carrier support apparatus is intermittently fed by an intermittent feed device. One electronic component located at the front end of the electronic component web carrier fed by the intermittent feed device is received and gripped at the first position by an electronic component grip device. The electronic component thus received and gripped by the electronic component grip device is separated from the electronic component web carrier by a cutting device. The electronic grip device gripping the electronic component separated by the cutting device is moved to the second predetermined position by a transfer device.

16 Claims, 50 Drawing Figures

FIG. 3
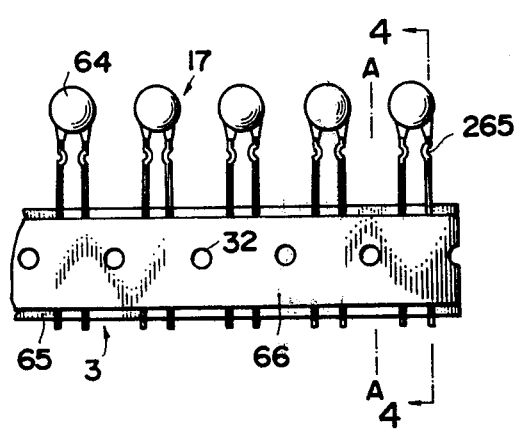
FIG. 4
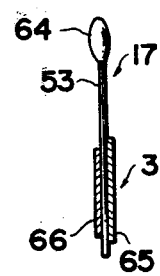
FIG. 5    FIG. 6
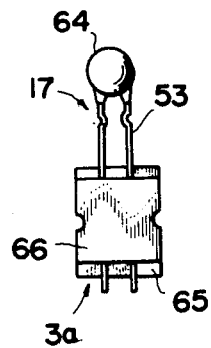 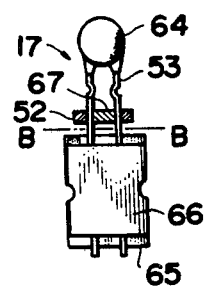
FIG. 7
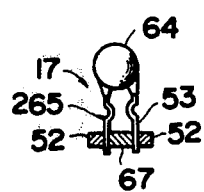
FIG. 8    FIG. 9
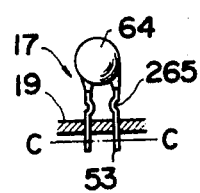 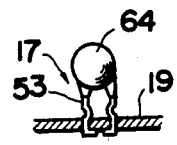

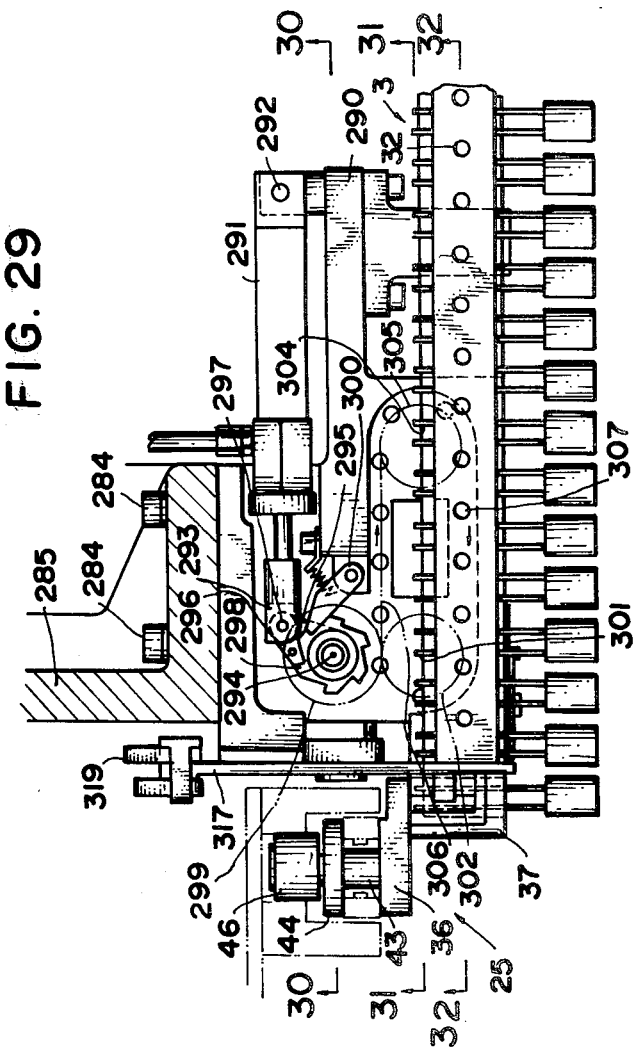
FIG. 29
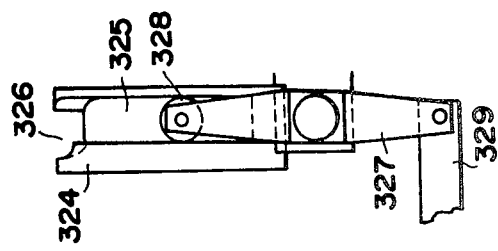
FIG. 27
FIG. 28

FIG. 38
FIG. 39
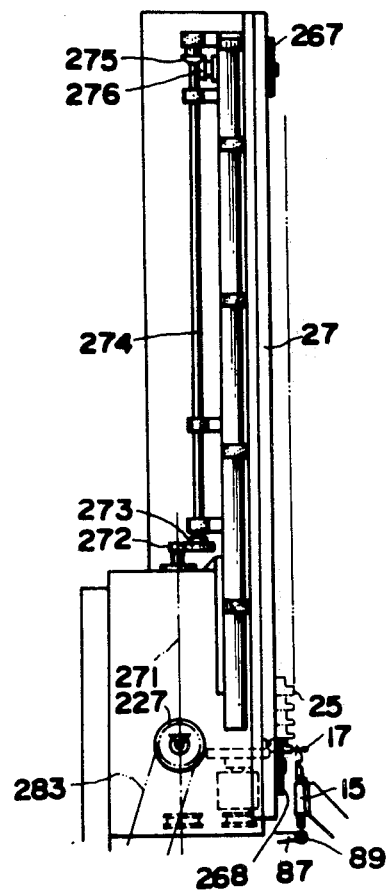
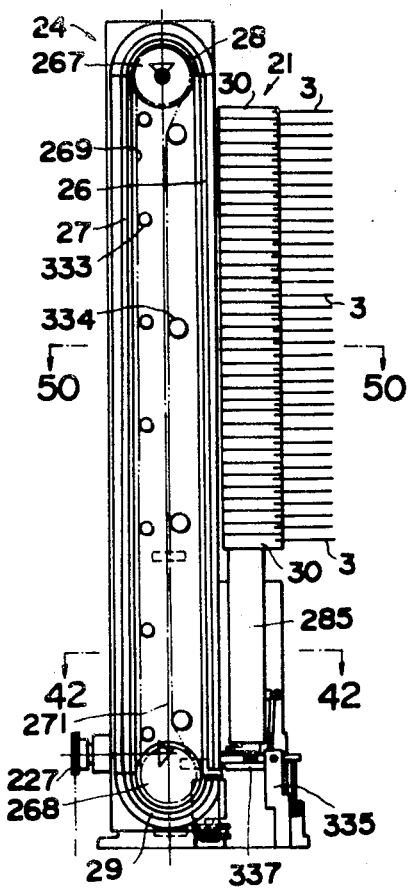

MACHINE FOR AUTOMATICALLY INSERTING PARALLEL LEAD ELECTRONIC COMPONENTS INTO A PRINTED CIRCUIT BOARD

BACKGROUND OF THE INVENTION

The present invention relates to a machine for automatically processing and inserting electronic components into a printed circuit board. More particularly, the invention relates to supply apparatus of such a machine, which selects a predetermined electronic component web carrier from a plurality of electronic component web carriers, separates electronic components individually from the electronic component web carrier, grips them and transfers them to a subsequent transfer device for transferring electronic components to inserting heads.

In the conventional technique of automatically inserting electronic components into a printed circuit board, when it is necessary to insert different kinds of electronic components into one printed circuit board, one inserting machine is used for one type of electronic components. Accordingly, if many types of electronic components are inserted, many inserting machines are used, so that the cost of equipment and operation are increased. Furthermore, the equipment requires a large space and the productivity is inevitably low.

In order to overcome the aforedescribed disadvantages, a method has been proposed in which a band-like electronic component web carrier includes different types of electronic components arranged in a predetermined order. The electronic components are separated from the web carrier and inserted into a printed circuit board one by one from one end of the web carrier. This method is, however, defective and disadvantageous, since different electronic component web carriers including electronic components arranged in a particular manner should be formed for different types of printed circuit boards, respectively, and should be stored individually. Accordingly, this method creates problems and difficulties in the manufacture and maintenance of electronic component web carriers. Furthermore, even when one of the electronic components of an electronic component web carrier has to be changed, for example, when the type of electronic component is changed because of a change in design or when an electronic component or its lead is damaged during transportation, storage or handling and should be replaced by a new one, the previously prepared electronic component web carrier having a specific arrangement of electronic components should be re-arranged. The method thus involves various difficulties and disadvantages from an industrial viewpoint.

A method has also been proposed in which a plurality of types of electronic component web carriers, each including one specific type of electronic component, are prepared. Predetermined electronic components are separated at their lead portions, one by one, according to a program. The separated electronic components are transferred by a chute in the free state to an inserting mechanism and are inserted into a printed circuit board, as disclosed in the specification of U.S. Pat. No. 3,777,350. In this method, however, leads are often damaged during the transfer and the precision of the distance or space between parallel leads is low, so that the inserting operation cannot be performed smoothly or efficiently.

The inventors have previously proposed an automatic inserting machine capable of eliminating the aforedescribed defects and disadvantages involved in the conventional techniques in U.S. Pat. No. 4,054,988 (DT-OS No. 2,614,002).

SUMMARY OF THE INVENTION

The principal object of the invention is to provide an improved supply mechanism for selectively supplying electronic components to a subsequent mechanism in an automatic inserting machine.

An object of the invention is to improve the automatic inserting machine previously proposed in U.S. Pat. No. 4,054,988.

Another object of the invention is to overcome the disadvantage of the automatic inserting machine disclosed in U.S. Pat. No. 4,054,988 by providing a shelf assembly which receives a plurality of electronic component web carriers and which is not moved in a vertical direction, and a specific transfer device for moving an electronic component grip member reciprocatively between shelves of the shelf assembly and the delivery or fixed position for delivery to the device for undertaking the subsequent step such as, for example, the transfer mechanism.

Still another object of the invention is to provide an automatic inserting machine for selecting predetermined electronic components very promptly in operation and effectively preventing difficulties such as damage or deformation of leads and reduction of precision in the spacing or distance of leads.

Yet another object of the invention is to provide an automatic inserting machine having a considerably improved automatic insertion capacity.

Another object of the invention is to provide an automatic inserting machine utilizing bridge members of small size and very small mass for delivering electronic components from the shelf assembly to the chunks of the transfer device thereby permitting considerable shortening of the time required for selection of a specific electronic component and a considerable increase in the capacity for supplying electronic components to the transfer device.

Still another object of the invention is to provide an automatic inserting machine which maintains very high precision of distance or space between the leads of an electronic component and performs the inserting operation with very great reliability at a very high speed, without problems or difficulties.

Yet another object of the invention is to provide an automatic inserting machine which utilizes bridge members of the same shape and holding units of the same shape, so that the bridge members and holding units are easily affixed and removed and maintenance, inspection and exchange thereof are greatly facilitated.

Another object of the invention is to provide an automatic inserting machine having a simple structure for moving the bridge members with reliability, pitch by pitch and at high speed, which structure operates without problems and difficulties and is maintained and inspected with facility.

Still another object of the invention is to provide an automatic inserting machine which delivers selected electronic components smoothly and reliably, and which feeds selected electronic components in a predetermined order from a variety of electronic component web carriers to the transfer mechanism reliably and at high speed.

Yet another object of the invention is to provide an automatic inserting machine which functions smoothly and with high reliability in inserting electronic components.

Generally, in accordance with the invention, a machine for processing and inserting parallel lead electronic components from electronic component web carriers into lead receiving openings in a printed circuit board has improved supply apparatus for selectively receiving an electronic component at a first position and supplying the electronic component to a second predetermined position. The supply apparatus includes a supply sub-assembly having electronic component web carrier support apparatus for supporting a plurality of electronic component web carriers at predetermined intervals. Each electronic component web carrier supported on the electronic component web carrier support apparatus is intermittently fed by an intermittent feed device. One electronic component located on the front end of the electronic component web carrier fed by the intermittent feed device is received and gripped at the first position by an electronic component grip device. The electronic component thus received and gripped by the electronic component grip device is separated from the electronic component web carrier by a cutting device. The electronic component grip device gripping the electronic component separated by the cutting device is moved to the second predetermined position by a transfer device.

BRIEF DESCRIPTION OF THE DRAWINGS

For a fuller understanding of the invention, reference is had to the following description, taken in connection with the accompanying drawings, in which:

FIG. 3 is a plan view of an embodiment of an electronic component web carrier;

FIG. 4 is a view, partly in section, taken along the lines 4—4, of FIG. 3;

FIGS. 5 to 9 are front views illustrating the processing of a separated electronic component in the automatic inserting machine;

FIG. 27 is a view, seen from the direction of an arrow 27 of FIG. 26;

FIG. 28 is a sectional view, taken along the lines 28—28, of FIG. 26;

FIG. 29 is a plan view, partly in section, of an embodiment of a holding unit of the automatic inserting machine of the invention in the state wherein an upper guide is removed;

FIG. 38 is a side view of another embodiment of the transfer device of the automatic inserting machine of the invention;

FIG. 39 is a front view of the embodiment of FIG. 38;

DESCRIPTION OF PREFERRED EMBODIMENTS

Figure 1:
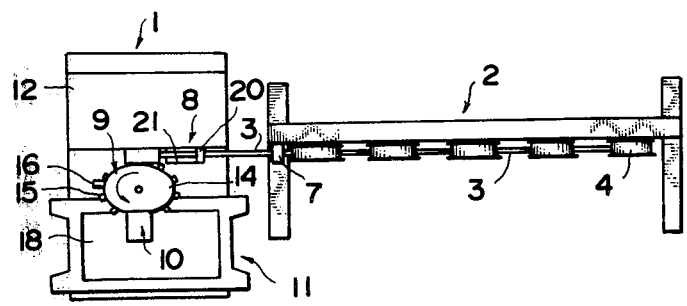
FIG. 1 is a plan view of an embodiment of an automatic inserting machine of the prior art.
Figure 2:
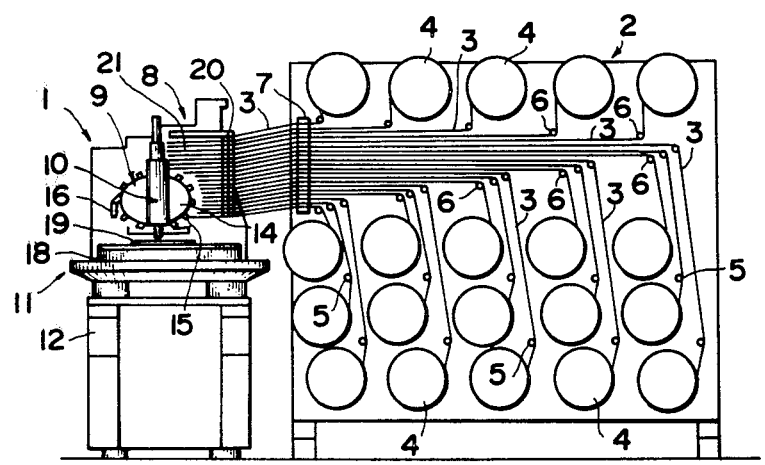
FIG. 2 is a front view of the embodiment of FIG. 1.

As illustrated in FIGS. 1 and 2, an inserting machine 1, a reel support assembly 2 and an NC panel (not shown in the Figs.) are the principal components of the machine previously proposed by the inventors. A plurality of reels 4 are rotatably supported on the reel support assembly 2 via shafts vertical to the surface of said reel support assembly. Electronic component web carriers 3, including electronic components supported by tapes, are wound on the reels 4, as shown in FIG. 3. The electronic component web carriers 3 include different types of electronic components, respectively, for example, condensers, and resistances or condensers of different capacities, are on the reels 4. The electronic component web carriers 3 unwound from the respective reels 4 are held horizontally in parallel with each other through guide rollers 5 and feed rollers 6 and are introduced into the inserting machine 1 through guides 7.

As shown in FIGS. 1 and 2, the inserting machine 1 comprises a supply mechanism 8, a transfer mechanism 9, an inserting mechanism 10, a table handling mechanism 11 and a frame member 12. The respective mechanisms of the inserting machine 1 function as follows.

The introduced electronic component web carriers 3 are held in the supply mechanism 8. A predetermined type of electronic component web carrier 3 is selected according to the NC program and individual electronic components are cut and separated at a position indicated by line A—A in FIG. 3 to form separated components 3a of the electronic component web carrier, as shown in FIG. 5. The separated components 3a are then fed to the transfer mechanism 9 where the components fed from the supply mechanism 8 are gripped by a rotary disc 14 and a plurality of chucks 15 disposed around said rotary disc. The rotary disc 14 rotates intermittently around an axis 13 inclined 45° to a horizontal plane. Excessive leads below line B—B in FIG. 6 are cut off by a cutting mechanism 16 during the rotating transfer, and the resulting electronic components 17, shown in FIG. 7, are held in the vertical state and transferred to the inserting mechanism 10. In the inserting mechanism 10, the received electronic component 17 is held by inserting heads and pushed down in a vertical direction. The leads of the electronic component 17 are inserted in predetermined openings of a printed circuit board. In the table handling mechanism 11, a printed circuit board into which electronic components 17 are to be inserted is held on a table 18 and said table is moved in a horizontal plane in directions X and Y, according to the NC program, so that predetermined openings of the printed circuit board are located just below the inserting heads. Excessive portions of the leads of the inserted electronic component 17 are cut off along lines C—C in FIG. 8, and the cut end portions of the leads are bent at right angles on the back side of the printed circuit board 19 to secure the electronic components, as shown in FIG. 9. The frame member 12 is disposed to hold and protect the aforedescribed mechanisms, which are affixed to said frame.

Referring to FIGS. 3 to 9, positioning and transfer round openings 32 are formed through the web carrier equidistantly between the leads of every pair of next-adjacent electronic components 17 and pierce a support band 65 and an adhesive tape 66. As is seen from the drawing, the width of the adhesive tape 66 is slightly less than the width of the support band 65. An electronic component element 64 has leads 53, as shown in FIGS. 4 to 9. A support member for supporting the electronic components 17 includes the support band 65 and the adhesive tape 66, and the leads 53 of said electronic components are firmly held between said band and said tape. The chuck 15 has a movable claw 52 and a fixed claw 67. A stopper 265 determines the insertion depth on insertion of the electronic component into the printed circuit board.

In this automatic inserting machine, as previously proposed, the supply mechanism 8 comprises a shelf assembly 21 including a plurality of shelves adapted to receive and hold the electronic component web carriers. The shelf assembly 21 as a whole is lower and raised up by a lift mechanism. According to the predetermined program or instructions, the shelf assembly 21 is moved in the vertical direction so that the shelf holding the predetermined type of electronic component web carrier 3 is selected and set at a predetermined height. One electronic component located at the front end of the selected and set web carrier is separated from the web carrier 3 and delivered to the subsequent transfer mechanism 9. A guide 20 is mounted on the shelf assembly 21 so that said guide is moved in a vertical direction with said shelf assembly.

The automatic inserting machine having the aforedescribed structure considerably improves operation efficiency and reliability over the conventional techniques. However, if the number of electronic component web carriers 3 to be processed and inserted is increased, the size of the shelf assembly 21 should be increased, so that the weight is increased. Accordingly, it becomes difficult to move the shelf assembly 21 rapidly and promptly in a vertical direction, so that enhancement of the speed of selection of electronic components to be inserted is naturally limited. The limitation of the moving speed of the shelf assembly is thus an obstacle to an increase of the capacity of the automatic inserting machine.

Figure 10:
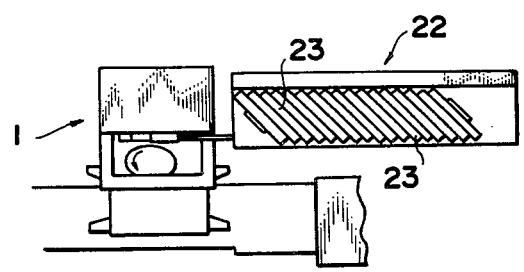
FIG. 10 is a plan view of an embodiment of the automatic inserting machine of the invention.
Figure 11:
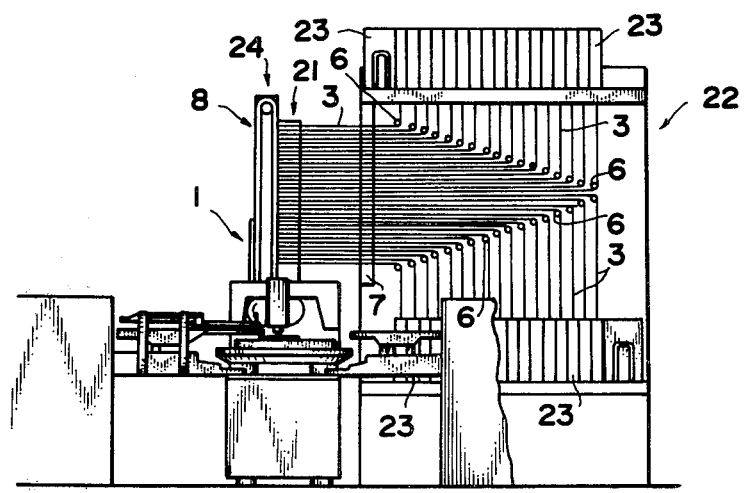
FIG. 11 is a front view of the embodiment of FIG. 10.

The principal components of the machine of the invention, as shown in FIGS. 10 and 11, are an inserting machine 1, a package support assembly 22 and an NC panel (not shown in the Figs.). A plurality of packages 23, having contained therein a rotatably mounted reel on which an electronic component web carrier 3 is wound, are disposed on the package support assembly 22. The electronic component web carriers 3 removed from the packages 23 are passed through a feed roller 6 and a guide 7 and are introduced into the inserting machine 1 in parallel with each other. The electronic component web carriers 3 differ in type in accordance with the NC program in the packages 23. The feed roller 6 is a sprocket wheel which is engaged with openings 32 (FIG. 3) of the electronic component web carrier 3, so that the predetermined electronic component web carrier is fed pitch by pitch by intermittent rotation of said feed roller. The guide 7 has a comb tooth structure, and one electronic component web carrier 3 is supported between every pair of next-adjacent comb teeth.

As shown in FIGS. 12, 13, 14 and 15, the inserting machine 1 comprises a supply mechanism 8, a transfer mechanism 9, an inserting mechanism 10, a table handling mechanism 11 and a frame member 12.

Figure 15:
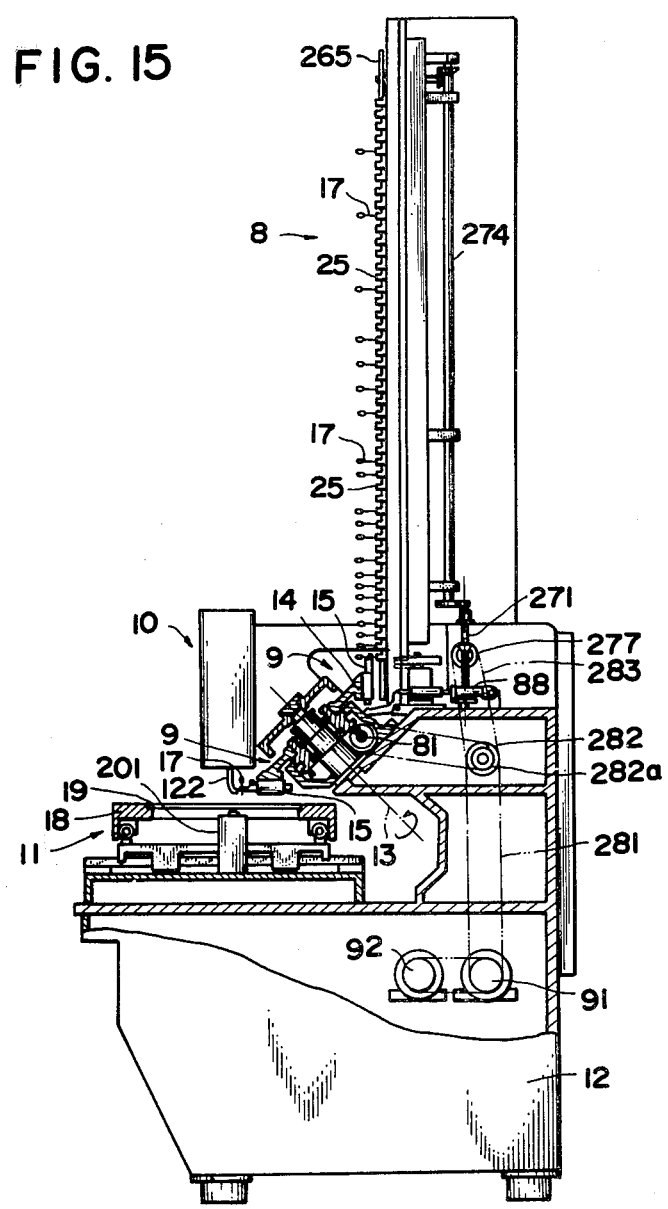
FIG. 15 is a view, partly in section, taken along the lines 15—15, of FIG. 12.

The supply mechanism 8 includes a shelf assembly 21 and the transfer device 24. The supply mechanism 8 is so constructed and arranged that a predetermined electronic component 17 is cut and separated from the electronic component web carrier 3 while cut pieces of support bands 65 and 66 are being attached thereto. The cut and separated electronic component is held in bridge members 25, making a vertical movement in the transfer device 24. The electronic component 17 is then delivered to a chuck 15 of the subsequent transfer mechanism 9 at a delivery position in the lower portion of the transfer device 24, as shown in FIG. 15.

Figure 13:
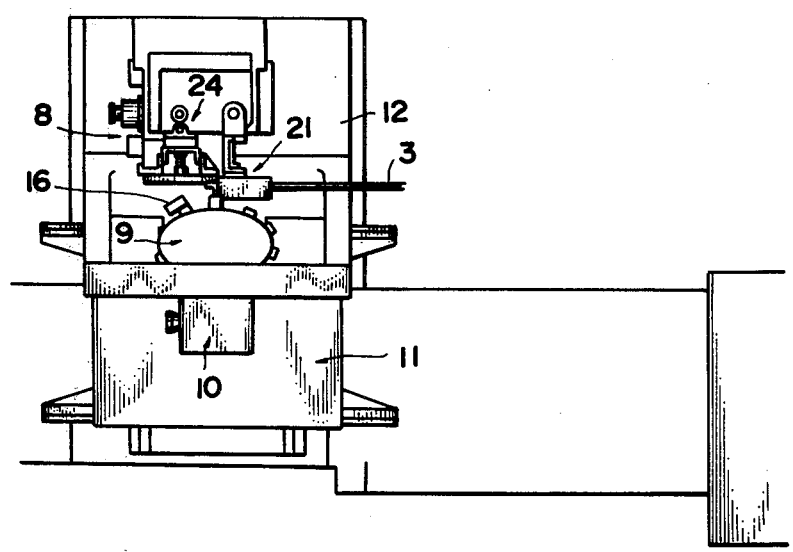
FIG. 13 is a plan view of the embodiment of FIG. 12.

As disclosed in U.S. Pat. No. 4,054,988, in the transfer mechanism 9, referring to FIG. 15, the electronic component 17 fed from the supply mechanism 8 is gripped by a rotary disc 14 intermittently rotating around an axis 13 inclined by 45° with a horizontal plane. A plurality of chucks 15 are mounted around the rotary disc 14. During this rotary transfer, excessive leads below the line B—B of FIG. 6 are cut out by a cutting device 16 (FIG. 13). The resulting electronic component 17, as shown in FIG. 7, is held in a vertical position and delivered in this state to the inserting mechanism 10. In the inserting mechanism 10, the received electronic component 17 is pushed down in a vertical direction by a push bar while being gripped by a lead press 122. The leads of the electronic component 17 are inserted into predetermined openings of a printed circuit board.

In the table handling mechanism 11, a printed circuit board 19, in which electronic components 17 are to be inserted, is held on a table 18 which is moved in a horizontal plane in directions X and Y according to the NC program, so that the predetermined inserting openings of the printed circuit board 19 are located just below the inserting mechanism 10. Excessive portions of the leads of the inserted electronic component 17 are cut out along a line C—C of FIG. 8 by a cutting and bending device 201. The cut ends of the leads are bent at right angles on the back side of the printed circuit board 19. Thus, the electronic component 17 is secured to the printed circuit board 19, as shown in FIG. 9. The frame member 12 is disposed to hold and protect the aforedescribed mechanisms, since said mechanisms are affixed to said frame. A clutch 91 and a prime mover 92 are provided.

The mechanism for selecting and feeding electronic components in the present invention is described in detail as follows.

Figure 16:
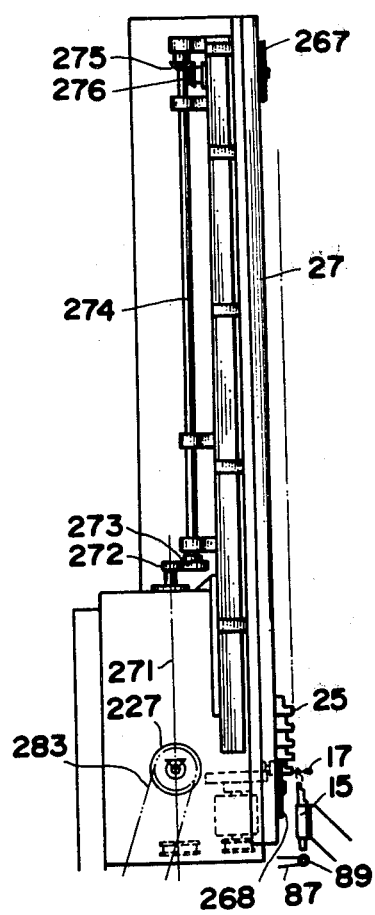
FIG. 16 is a side view of an embodiment of the transfer device of the automatic inserting machine of the invention.
Figure 17:
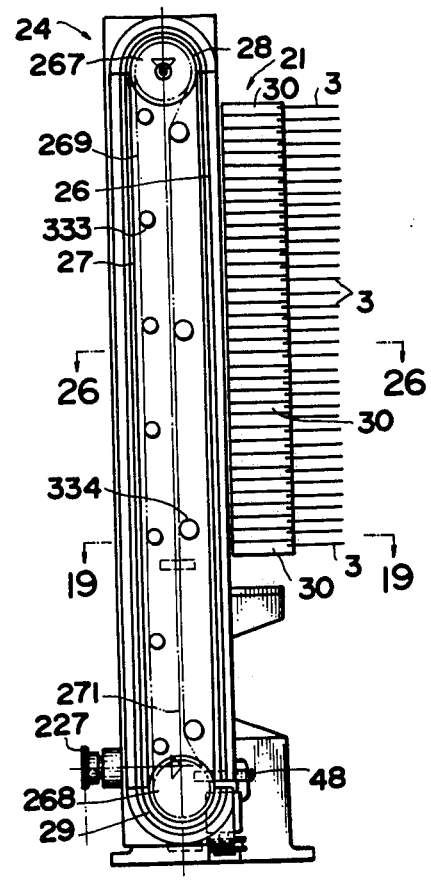
FIG. 17 is a front view of the embodiment of FIG. 16.

The supply mechanism 8 of the present invention, as entirely shown in FIG. 11, comprises a shelf assembly 21 and a transfer device 24. As shown in FIGS. 16 and 17, the transfer device 24 includes a descending guide 26 and an ascending guide 27 which are arranged vertically in parallel with each other. Connecting guides 28 and 29 are affixed to the upper and lower ends of both guides to place said guides in communication with each other, whereby a circulation passage is formed. The descending guide 26 is disposed contiguously to each holding unit 30 as electronic component web carrier holding apparatus in the shelf assembly 21. Guide grooves 33, 34 and 35 (FIGS. 18, 19 and 20) are formed on the descending guide 26, the ascending guide 27 and the connecting guides 28 and 29. A plurality of bridge members 25, as an electronic component grip device, are slidably and movably guided in the grooves 33, 34 and 35.

Figure 21:
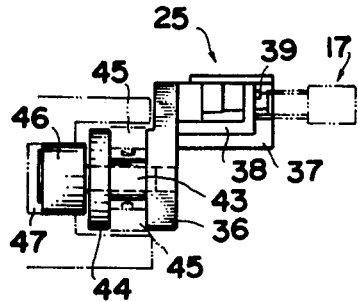
FIG. 21 is a plan view of an embodiment of a bridge member of the automatic inserting machine of the invention.
Figure 22:
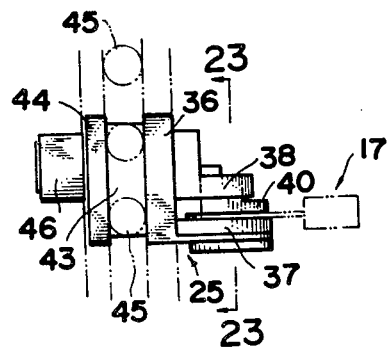
FIG. 22 is a side view of the embodiment of FIG. 21.
Figure 23:
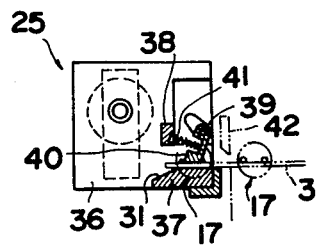
FIG. 23 is a view, partly in section, taken along the lines 23—23, of FIG. 22.

As illustrated in detail in FIGS. 21, 22 and 23, a grip stand 37, a bracket 38 and a fulcrum pin 39 are mounted in each bridge member 25 on the front face of a bridge proper 36. A grip claw 40 is rotatably mounted on the fulcrum pin 39 and is always urged and pressed to the grip stand 37 by a spring 41. Since the face of the grip claw 40 is inclined with respect to a central line in order to butt against the grip stand 37, said claw is caused to butt against said grip stand in an inclined manner, as shown in FIG. 23. Accordingly, when the electronic component web carrier 3 is inserted between the grip stand 37 and the grip claw 40 from right to left in FIG. 23, since said grip claw is permitted to escape while pressing the spring 41, insertion is possible.

However, when the electronic component web carrier 3 is pulled from left to right, the grip claw 40 grips said electronic component web carrier by an action similar to a wedge action and said web carrier 3 is not permitted to move. The spring 41 is required to exert such a force that the leads of the cut electronic component 3a (FIGS. 5 and 18), separated from the electronic component web carrier 3 by cutting support bands 65 and 66 (FIG. 3), but still having the cut pieces of the bands 65 and 66 attached thereto, may be firmly secured. The support bands 65 and 66 are cut by a cutter 42, hereinafter described. An inclined face 31 permits escape, as hereinafter described.

A guide block 43 having a narrow width is mounted on the back face of the bridge proper 36, and said guide block 43 is guided in a groove formed between a back plate 44 and the back face of said bridge proper by a guide roller 45 in the descending guide 26. A cam follower roller 46 is mounted on the back face of the back plate 44 and is guided through a groove 47 in the descending guide 26.

Figure 24:
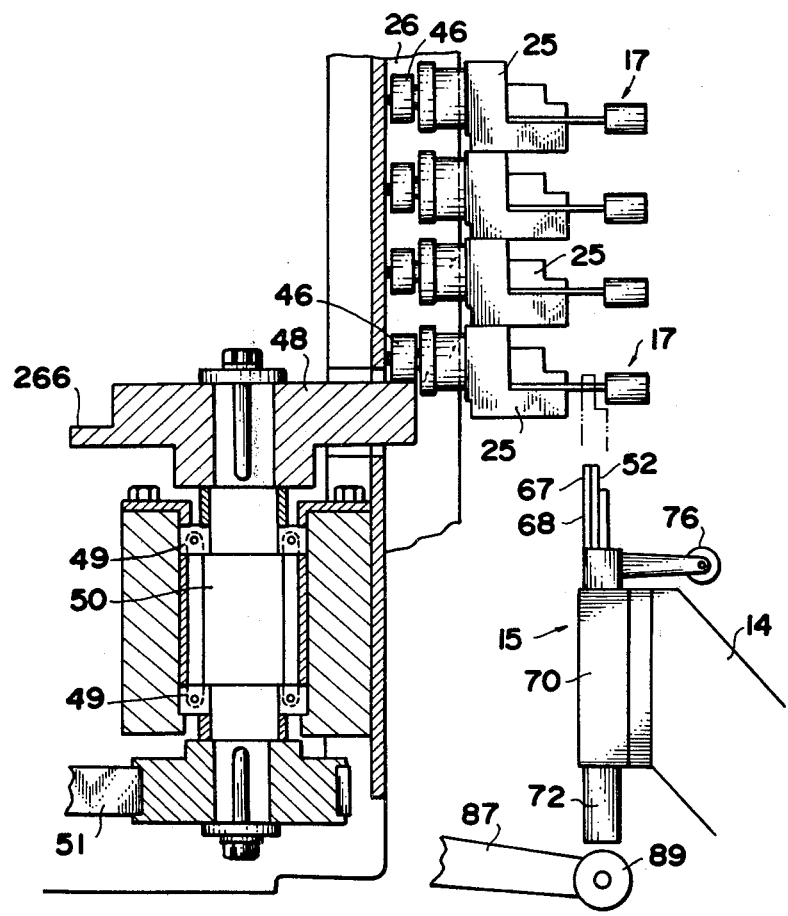
FIG. 24 is a view, partly in section, taken along the lines 24—24, of FIG. 18.

The bridge members 25 are closely stacked on each other in the descending guide 26, as shown in FIGS. 15, 18, 20 and 24. The lowermost bridge member 25 is supported, since the cam follower roller 46 butts against the top face of an index cam 48 (FIG. 24). Other bridge members 25 are stacked on the lowermost bridge member, so that the level of the uppermost bridge member is higher than the level of the uppermost holding unit 30. Since the height of each bridge member 25 is made equal to the pitch of the holding units 30 in the state shown in FIG. 24, each said bridge member is held at the same position as that of the corresponding holding unit 30. Accordingly, as hereinafter described in detail, the electronic component web carrier 3 fed out from the holding unit 30 is horizontally fed to arrive at the top face of the grip stand 37 of the bridge member and is thus gripped by the grip claw 40.

The bridge member 25 is not shown in FIG. 17 in order to maintain the clarity of illustration. Actually, however, the bridge members 25 are stacked in the descending guide 26 along the entire vertical length thereof, so that they confront the corresponding holding units 30, and several of the bridge members are scatteredly located in the ascending guide 27 and are moved upward.

Figure 25:
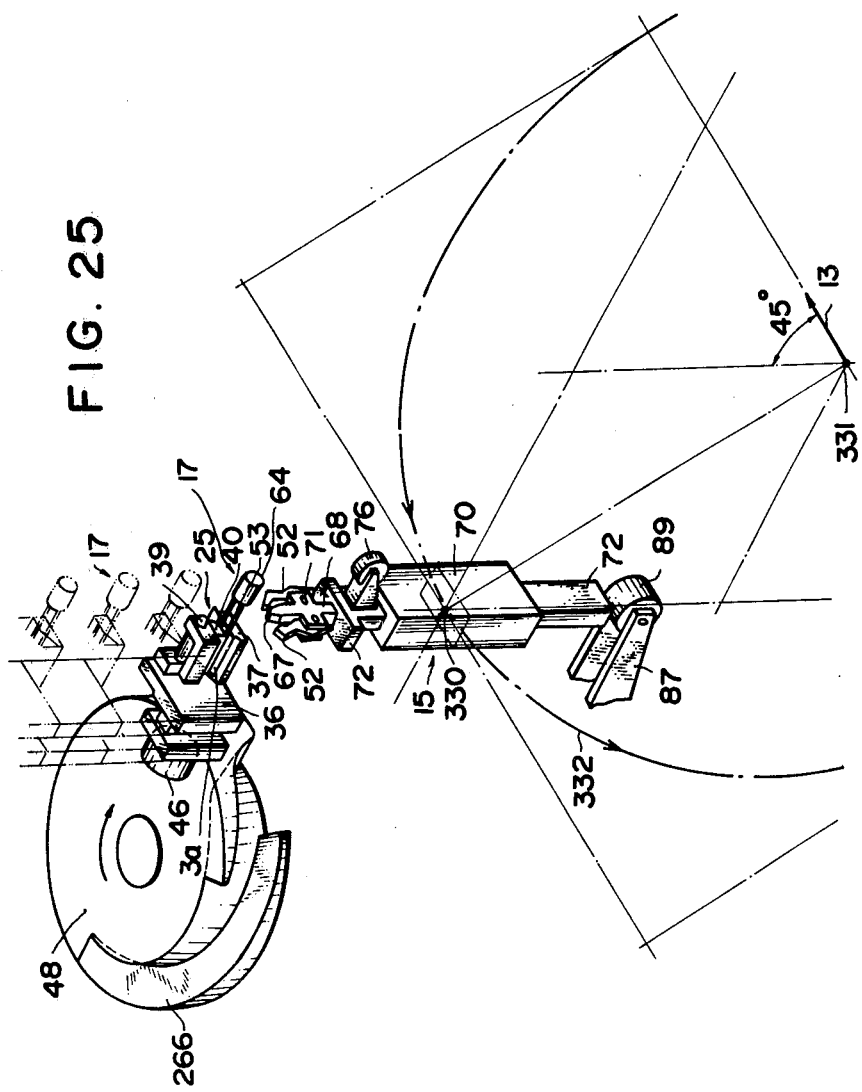
FIG. 25 is a perspective view of an embodiment of an index cam and a chuck of the automatic inserting machine of the invention.

The position of the lowermost bridge member 25 shown in FIG. 24 is a delivery position where the electronic component 17 is delivered to the chucks 15 mounted on the rotary disc 14 of the subsequent transfer mechanism 9. The chucks 15 may comprise, fo example, those disclosed in U.S. Pat. No. 4,054,988. Each chuck 15 has an outer block 70, an intermediate block 72 slidably mounted in said outer block, and an inner block 68 slidably mounted in said intermediate block, as shown in FIGS. 24 and 25. A movable claw 52 rotatably mounted via a pin 71 and a fixed claw 67 integrated with the inner block 68 are provided in said inner block. When a roller 89 is lifted up by the action of a bell crank 87 via a cylinder 88 (FIG. 15) to push up the intermediate block 72, said intermediate block is raised up.

The raising of the intermediate block 72 causes the fixed claw 67 and the movable claw 52 to be lifted up in the open state. When the claws 52 and 67 reach the height of the leads 53, the inner block 68 is stopped. Only the intermediate block 72 continues to be lifted up to push up and expand the rear end of the movable claw 52 while keeping the front end of said movable claw in the closed state. On the other hand, when a roller 76 is pressed downward, the grip on the leads 53 is released by the reverse operation. The movable claw 52 is urged in an opening direction by a spring.

As shown in FIG. 24, the index cam 48 is attached to a shaft 50 supported on a bearing 49 and is rotated by a circulating hang member 51 such as, for example, a chain or belt. As shown in FIG. 25, the cam follower roller 46 of the bridge member 25 is placed on the top face of the index cam 48, and a turning passage of said cam follower roller is provided in the vicinity of the peripheral edge of the top face of said index cam 48. About ⅓ to about ⅓ of the circumference of the turning passage has a flat face. However, an inclined face 266 is formed in the other portion of the top face of the index cam 48, so that the cam follower roller 46 gradually descends with rotation of said index cam. The terminal end of the inclined face 266 overlaps the flat turning passage on the top face.

The flat turning passage and inclined face 266 make it possible to feed out one bridge member 25 downwardly after it has been stopped at a predetermined position for a predetermined time and to stop the subsequent bridge member at the predetermined position for the predetermined time. Accordingly, it is possible to perform such one-pitch feeding that during one rotation of the index cam 48, all the bridge members 25 stacked in the descending guide 26 are simultaneously stopped for a predetermined time, simultaneously brought down by one pitch, and then simultaneously stopped again for a specific period. Simultaneously, one lowermost bridge member 25 can be assuredly fed out.

A circulating chain 269 is provided in order to raise up again the bridge member 25 which has been fed out downwardly from the index cam 48 and permitted to descend or fall down to the lower end of the connecting guide 29. The circulating chain 269 is hung on sprocket wheels 267 and 268 and guided by guide rollers 333 and 334 (FIG. 17). Hook links are mounted at predetermined intervals on the circulating chain 269, as shown in FIG. 18, so that with the movement of said circulating chain, said hook links hook the bridge members 25 and raise them along the ascending guide 27.

Figure 19:
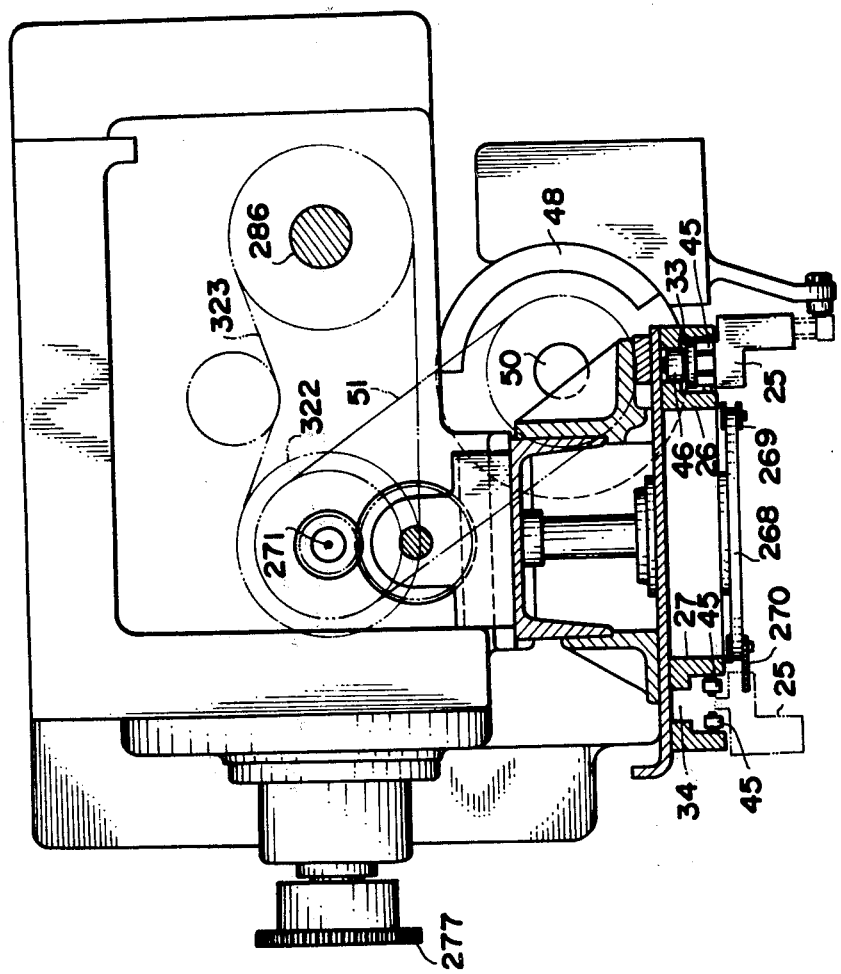
FIG. 19 is a view, partly in section, taken along the lines 19—19, of FIG. 17.
Figure 20:
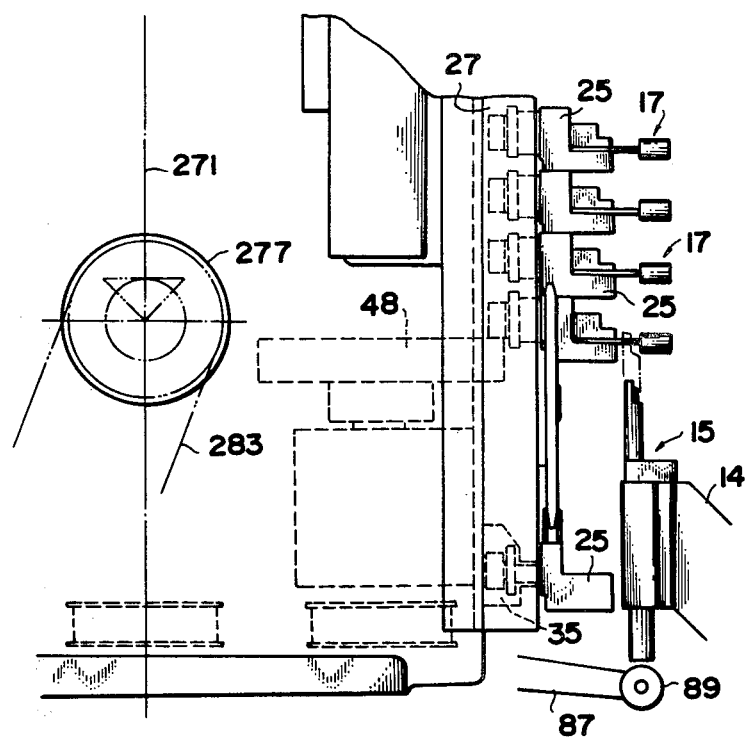
FIG. 20 is a view, on an enlarged scale, of the lower part of the transfer device of FIG. 16.

The index cam 48 and sprocket wheel 267 are driven by rotation of a main shaft 271. More specifically, the shaft 50 of the index cam 48 is driven by the main shaft 271 via a circulating hang member 51 such as, for example, a chain or belt, as shown in FIG. 19. Furthermore, as shown in FIG. 16, the sprocket wheel 267 is driven via a pinion 272, a gear 273, a shaft 274 and bevel gears 275 and 276.

Figure 18:
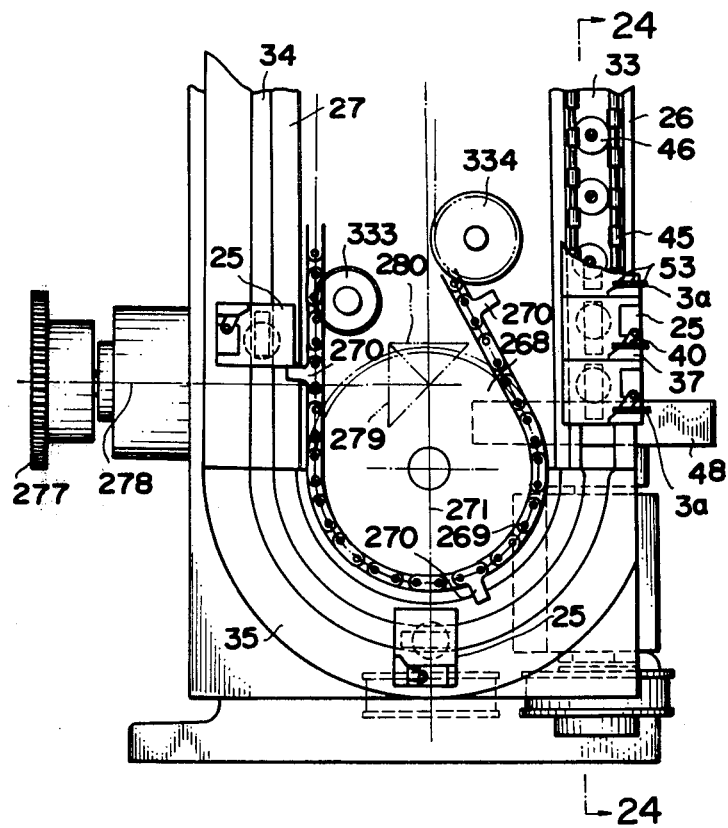
FIG. 18 is a front view, on an enlarged scale, of the lower part of the transfer device of FIG. 16.

As shown in FIG. 18, the main shaft 271 is driven via a sprocket wheel 277, a horizontal shaft 278 and bevel gears 279 and 280. As shown in FIG. 15, the sprocket wheel 277 is driven by a prime mover 92, having a clutch 91, via a chain 281, a sprocket wheel 282 and a chain 283. An intermittent barrel cam 81 is driven by a sprocket wheel 282a coaxial with the sprocket wheel 282 to intermittently rotate and drive the rotary disc 14, as shown in FIG. 15, whereby the index cam 48 is made synchronous with the chucks 15.

Figure 14:
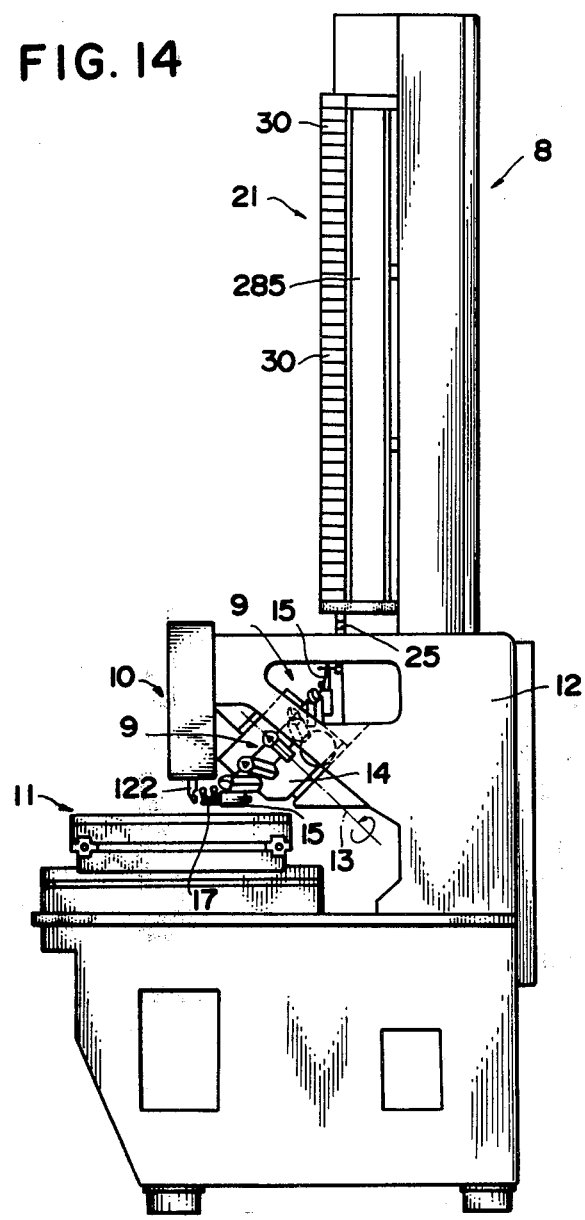
FIG. 14 is a side view of the embodiment of FIG. 12.
Figure 26:
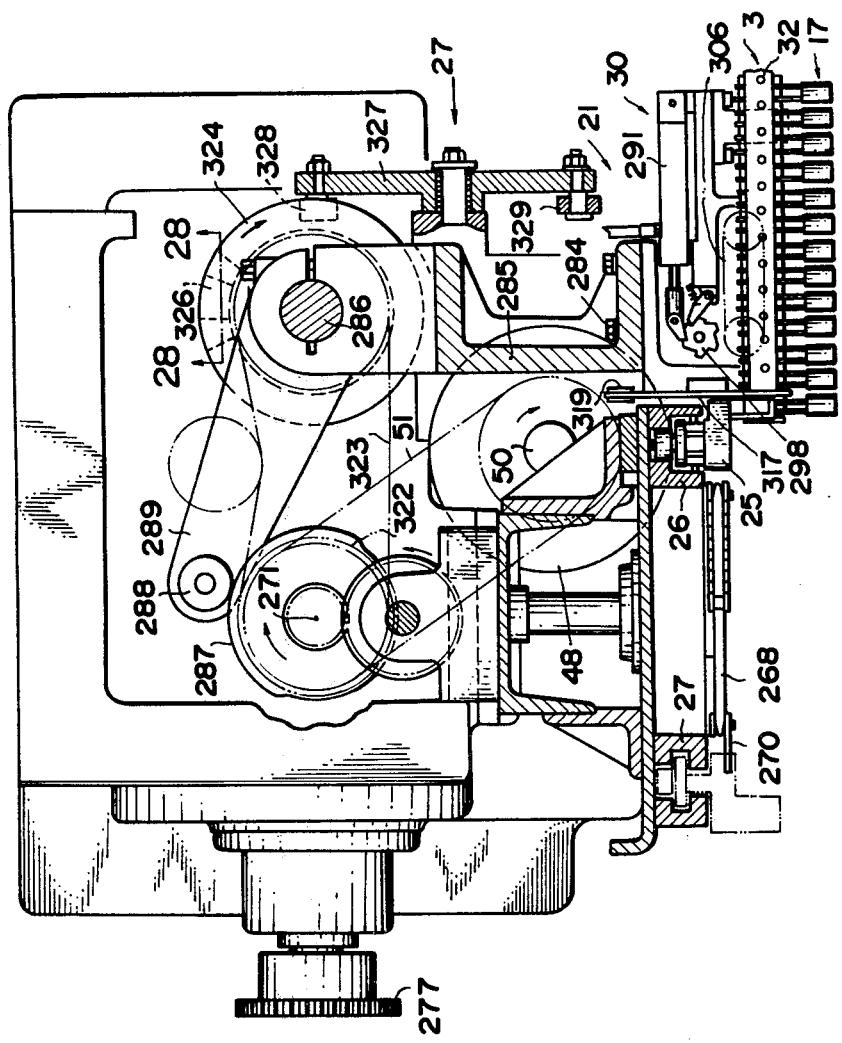
FIG. 26 is a view, partly in section, taken along the lines 26—26, of FIG. 17.

The shelf assembly 21 is described as follows. A plurality of holding units 30 are removably affixed to a post 285 in the shelf assembly 21 via a bolt 284 and are arranged at equal pitches in the longitudinal direction (FIGS. 14 and 26). As shown in FIG. 26, the post 285 is affixed to a rotatable vertical shaft 286 and said shaft is arranged so that it is permitted to swing by a slight angle, of about 7 to 12 mm at the position of the holding unit 30, via a lever 289 due to a roller 288 falling in contact with a cam 287 affixed to the main shaft 271.

Figure 30:
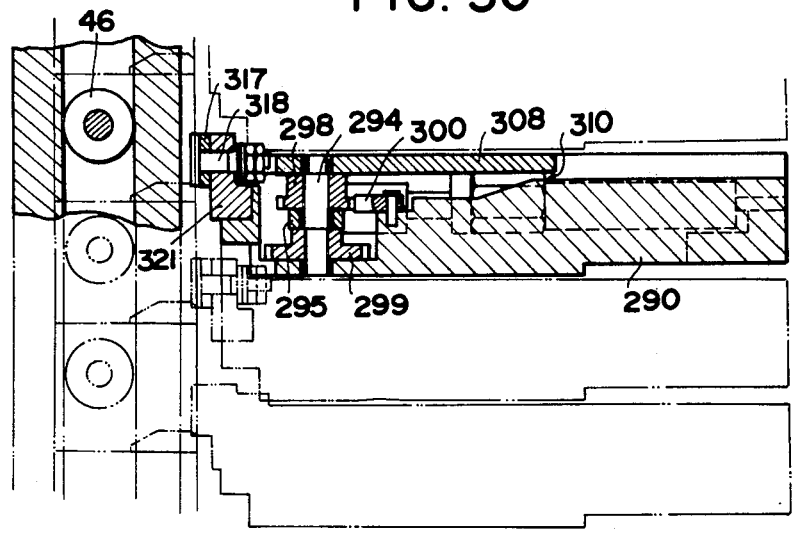
FIG. 30 is a view, partly in section, taken along the lines 30—30, of FIG. 29.
Figure 34:
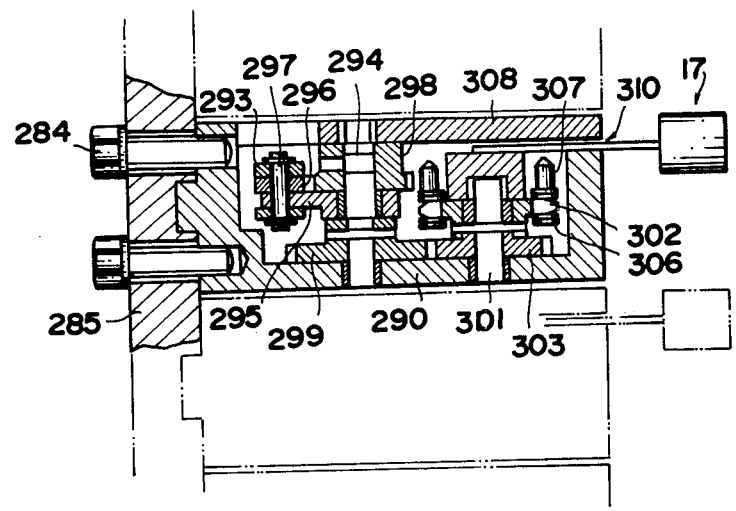
FIG. 34 is a view, partly in section, taken along the lines 34—34, of FIG. 31.
Figure 35:
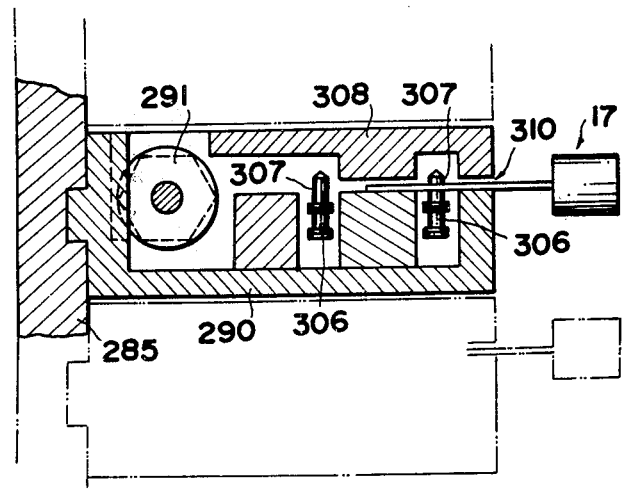
FIG. 35 is a view, partly in section, taken along the lines 35—35, of FIG. 31.

The holding units 30 are described as follows. An air cylinder 291 is swingably affixed to a casing 290 via a pin 292 (FIG. 29). A fork end 293 on the top end of the air cylinder 291 is affixed together with a claw 296 to a lever 295 disposed rotatably around a ratchet shaft 294 via a pin 297. As shown in FIGS. 30 and 34, a ratchet wheel 298 and a gear 299 are affixed to the ratchet shaft 294. A claw 300 prevents reverse rotation.

Figure 31:
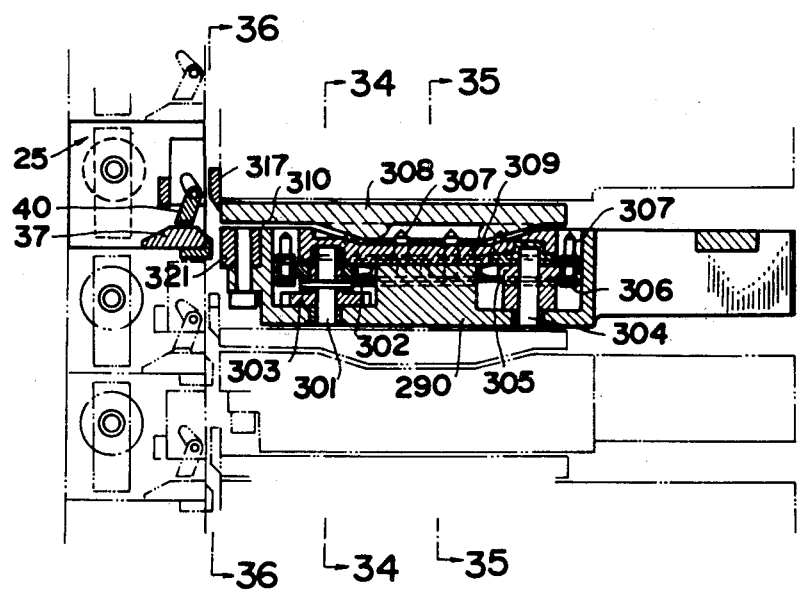
FIG. 31 is a view, partly in section, taken along the lines 31—31, of FIG. 29.

As shown in FIGS. 31 and 34, a sprocket wheel 302 and a gear 303 are affixed to a sprocket shaft 301. As shown in FIG. 31, a sprocket wheel 305 is affixed to a sprocket shaft 304. A feed chain 306 is hung on the sprocket wheels 302 and 305. Feed pins 307 are mounted on an extension of a link pin of the feed chain 306 for holding and feeding the electronic component web carrier 3. The feed pins 307 are mounted at the same pitch as that of the openings 32 of the electronic component web carrier 3, so that said pins are disposed upwardly in a vertical direction.

The electronic component web carrier 3 is introduced to the position shown in FIG. 29 along the linear portion of one side of the feed chain 306. In order to adjust the vertical position of the electronic component web carrier 3, an upper guide 308 and a lower guide 309 are provided, as shown in FIG. 31. A passage 310 for the electronic component web carrier 3 is formed by a gap between the upper and lower guides 308 and 309. As shown in FIG. 31, the level of the passage 310 for the electronic component web carrier 3 is lower than the level of the top end, or the boundary of the conical portion, of the effective diameter, or cylindrical portion of the feed pin 307 at a part of the linear portion of the feed chain 306. The level of the passage 310 is much higher than the level of the top end of the feed pin 307 in the portion of the feed chain 306 where said chain is hung on the sprocket wheels 302 and 305.

Figure 33:
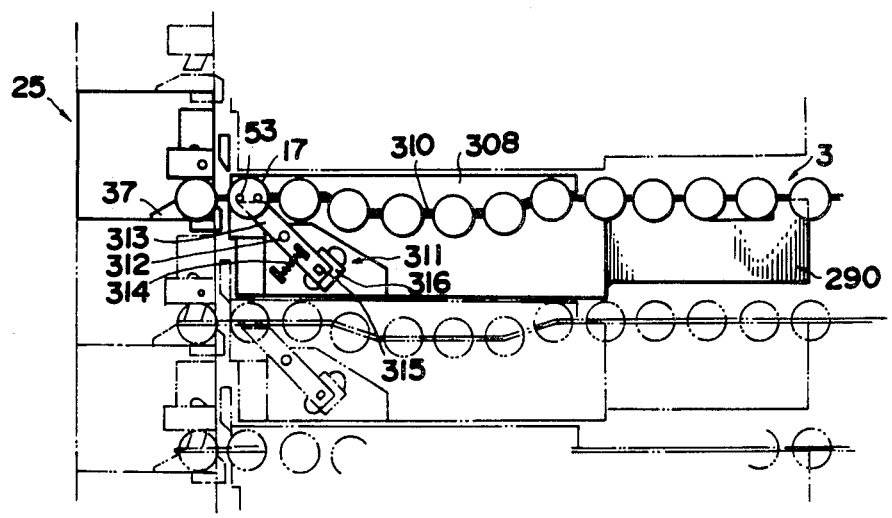
FIG. 33 is a front view of the holding unit of FIG. 29.

A detecting mechanism 311 is provided to detect the absence of the electronic component 17 in the electronic component web carrier 3 (FIG. 33). A lever 313, rotatably mounted around a pin 312, is pressed by a push spring 314 so that one end of said lever butts against the leads. The lever 313 is so positioned that in the state where one end of said lever butts against the leads 53, the position of a hole element 316 of the casing 290 comes into agreement with the position of a magnet 315 disposed on the other end of said lever. When the electronic component 17 is absent, the lever 313 is turned by the push spring 314 and the magnet 315 is moved to a position out of agreement with the position of the hole element 316 whereby the absence of the electronic component is detected.

Figure 36:
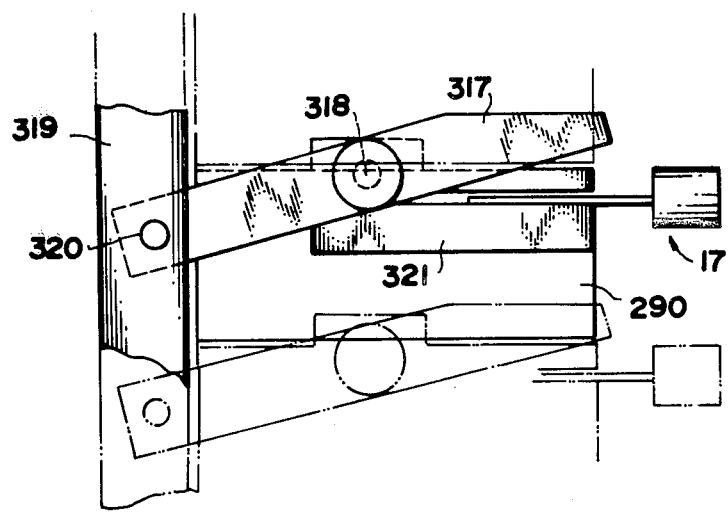
FIG. 36 is a view, taken along the lines 36—36, of FIG. 31.

A cutter 317 is rotatably mounted around a pin 318 (FIG. 36). The cutters 317 mounted on the respective holding units 30 are affixed to one vertical rod 319 by pins 320. The vertical movement of the rod 319 cuts the support bands 65 and 66 between the cutter 317 and a fixed blade 321 (FIG. 3).

The cutter 317 is driven by rotation of the main shaft 271. More specifically, as shown in FIG. 26, a cam wheel 324 is rotated via a chain 323 by a sprocket wheel 322 mounted on the main shaft 271. As shown in FIGS. 27 and 28, a curved portion 326 is formed in part of a guide groove 325 of the cam wheel 324. A lever 327 is swung by a roller 328 mounted on one end of said lever to move a rod 329 on the other end of said lever in a vertical direction. The top end of the rod 329 is connected to the top end of the rod 319 via a link mechanism (not shown in the FIGS.), so that when the rod 329 is brought down, the rod 319 is lifted up.

The operation of the aforedescribed air cylinder 291 is such that the valve to said air cylinder is controlled by detection of the rotation of the main shaft 271 to permit said air cylinder to make one reciprocative movement while said main shaft makes one rotation. The ratchet wheel 298 is advanced by one tooth by the reciprocative movement of the air cylinder 291 to move the feed pins 307 of the feed chain 306 by one pitch through the gears 299 and 303 and the sprocket wheel 302, whereby the electronic component web carrier 3 is advanced by one pitch.

Figure 12:
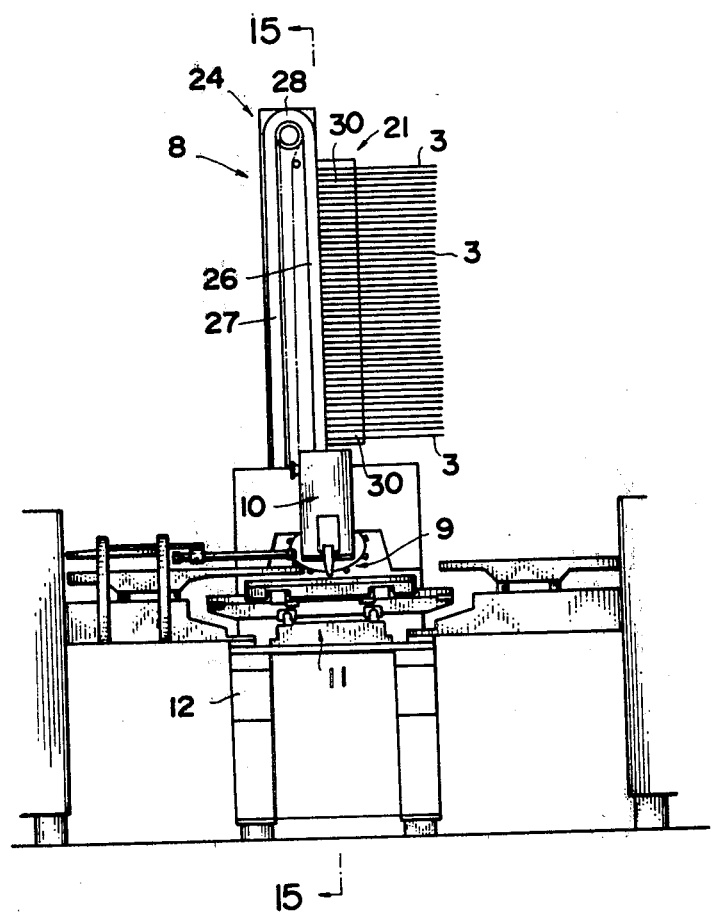
FIG. 12 is a front view of an embodiment of the automatic inserting machine of the invention.

The function of the mechanism for selecting and feeding the electronic components according to the present invention is described as follows. As shown in FIGS. 11 and 12, many types of electronic component web carriers 3 are introduced to the shelf assembly 21. As shown in FIGS. 26 through 35, each electronic component web carrier 3 is contained in the electronic component web carrier passage 310 of the holding unit 30 and is held and supported by the feed pins 307. The state where the top end of each electronic component web carrier 3 does not protrude from the edge of the fixed blade 321 is first described. At this point, the index cam 48 receives the cam follower roller 46 on the flat portion of the top face, and the bridge members 25 stacked in the descending guide 26 beyond the uppermost holding units 30 are kept stationary while they confront the holding units of the respective stages. The roller 288 rides on the ridge of the cam 287 and the shelf assembly 21 is located contiguously to the respective bridge members 25. The roller 328 is located on the flat portion of the guide groove 325 and the cutter 317 is in the open state.

Figure 32:
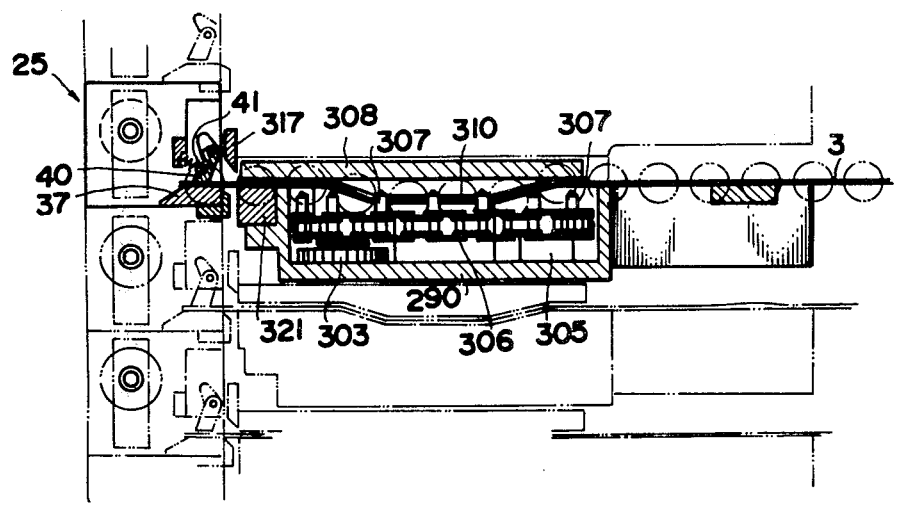
FIG. 32 is a view, partly in section, taken along the lines 32—32, of FIG. 29.

The rotation of the main shaft 271 is advanced, and, according to the program, compressed air is supplied to the air cylinder 291 mounted on the predetermined holding unit 30 and said air cylinder is permitted to make one reciprocative movement. The ratchet wheel 298 is advanced by one tooth by the claw 296. As hereinbefore described, the electronic component web carrier 3 is advanced by one pitch of the openings 32 and the top end of said electronic component web carrier is inserted in the grip stand 37 of the bridge member 25, standing by, while confronting the top end of said electronic component web carrier and is introduced while moving the grip claw 40 aside. One electronic component on the top end of the electronic component web carrier 3 which has been fed by one pitch and is stopped, is firmly gripped between the grip stand 37 and the grip claw 40 via the support bands 65 and 66 (FIG. 32).

When the main shaft 271 is further rotated, the roller 328 is lifted up by the curved portion 326. As hereinbefore described, the cutter 317 is operated through the rods 329 and 319 to cut the electronic component web carrier 3 between the cutter 317 and the fixed blade 321. At this point, one electronic component 17 having the cut pieces of the support bands 65 and 66 attached thereto, that is, in the separated state 3a shown in FIG. 5, is firmly secured to the bridge member 25 (FIG. 18).

The cylinder 88 is operated substantially simultaneously to move the bell crank 87 and cause the roller 89 to push up the intermediate block 72 of the chuck 15. As hereinbefore described, the fixed claw 67 and the movable claw 52 are permitted to arrive at the level of the electronic component 17 held on the lowermost bridge member 25 and they firmly grip the leads 53 of said electronic component (FIG. 24). Rotation of the rotary disc 14 is then initiated by the intermittent barrel cam 81 (FIG. 15) and the chuck 15 begins to move.

The movement of the chuck 15 at this point is described as follows. As shown in FIG. 25, the center 330 of the chuck 15 moves along a circumference such as a locus 332 having a center 331 in a plane perpendicular to the axis 13 of the rotary disc 14, that is, in a plane inclined by 45° with a horizontal plane. Accordingly, the chuck 15 begins to move in a substantially horizontal direction while gripping the leads 53 of the electronic component 17 at its top end. Since this direction of movement is one releasing the grip claw 40, the separated piece 3a, including the electronic component 17, is removed from the grip claw 40 and is transferred while the leads 53 are gripped by the chuck 15. When the separated piece 3a, including the electronic component 17, is removed from the bridge member 25, said electronic component makes a circular movement. However, the electronic component 17 is permitted to avoid interference by the grip stand 37, because of the inclined face 31 thereof.

The vertical shaft 286 is rotated by the roller 288 and the lever 289 via the trough of the cam 287 substantially simultaneously with the removal of the electronic component 17 from the lowermost bridge member 25. As hereinbefore described, the shelf assembly 21 separates from the bridge members 25, so that the gap between the bridge member and the holding unit 30 is broadened by about 7 to 12 mm. After the electronic component 17 held on the lowermost bridge member 25 has been removed by the chuck 15, as hereinbefore described, the inclined face 266 of the index cam 48 is moved just below the descending guide 26.

The cam follower roller 46 is permitted to roll on the inclined face 266, whereby the lowermost bridge member 25 is gradually brought down. At such point, many bridge members 25 stacked on the lowermost bridge member are simultaneously brought down. Before the cam follower roller 46 of the lowermost bridge member reaches the terminal end of the inclined face 266, the overlapped top face of the index cam 48 supports the cam follower roller 46 of the subsequent bridge member 25 to stop the downward movement. When the lowermost bridge member 25 separates from the inclined face 266, it moves downward by the action of gravity and is received in the guide groove 35. The bridge member 25 thus arrives at the lowermost point.

The circulating chain 269 is always driven and rotated by the sprocket wheel 267, and, as shown in FIG. 18, said circulating chain picks up the bridge member 25 at the lowermost point via the hook link 270 and moves said bridge member upward along the ascending guide 27. Then, the bridge member 25 is passed through the connecting guide 28 and is again fed to the uppermost part of the descending guide 26. The speed of the circulating chain 269 is much greater than the descending speed of the bridge member 25 in the descending guide 26, which is brought down by the index cam 48. The speed of the circulating chain 269 and the space of the hook link 270 are appropriately adjusted so that the level of the uppermost bridge member 25 in the descending guide 26 is not lower than the level of the uppermost holding unit 30.

When the subsequent bridge member 25 rides on the flat portion of the top face of the index cam 48 and the downward movement is stopped, the roller 288 rides on the ridge of the cam 287, the shelf assembly 21 is rotated and the holding units 30 are again brought close to said bridge members. The aforedescribed cycle is repeated, and each bridge member 25 is brought down by one holding unit 30 in every cycle.

The delivery of the electronic component web carrier 3 from the holding unit 30 to the bridge member 25 is now described with respect to one specific cycle. The air cylinder 291 of only one or more of the specific holding units selected from the plurality of holding units according to the program is operated. The electronic component web carrier 3 held on the selected specific holding unit 30 is fed to the corresponding bridge member 25. When a specific bridge member 25 reaches the uppermost part of the descending guide 26, the electronic component 17 to be received by said bridge member is already set. The specific bridge member 25 is brought down pitch by pitch according to the aforedescribed cycle. Only when the specific bridge member 25 confronts the holding unit 30 which holds the electronic component web carrier 3 having the specific electronic component 17, does it receive said electronic component, while other holding units 30 pass through without delivery of the electronic components.

The electronic components 17 are thus held in due course by the bridge members 25 and they reach the lowermost position for delivery of said electronic components to the chucks 15 of the transfer mechanism, as the subsequent step. The electronic components 17 are thus successively delivered to the chucks 15.

In the described embodiment, electronic components are delivered from the shelf assembly as the receiving position to the chucks 15, as the delivery position, of the transfer mechanism 9 of the subsequent step through the bridge members 25 having a small size and a very small mass. This feature permits considerable shortening of the time required for selection of the specific electronic component and permits a considerable increase in the capacity for supplying electronic components to the transfer mechanism 9, as the subsequent step. The insertion capacity of the automatic inserting machine may therefore by considerably improved. Furthermore, even while the electronic component selected from the shelf assembly is being transferred to the chuck 15 of the transfer mechanism 9, the leads 53 are firmly gripped by the grip claw 40 and the grip stand 37 in the state where they are restrained by the cut support bands 65 and 66 of the separated electronic component 3a. Accordingly, the leads 53 are always restrained throughout a period from the point of unwinding of the electronic component web carrier 3 from the reel to the point of insertion of the electronic component into the printed circuit board. The deformation of the leads 53 or loss of the precision of the distance or space between said leads by an external force may therefore be effectively prevented. Thus, very high precision of distance or space between the leads 53 is maintained, and the inserting operation may be performed with very great reliability, at a very high speed, without problems or difficulties.

Since bridge members 25 of the same shape and holding units 30 of the same shape are used, they may easily be affixed and removed. Thus, maintenance, inspection and exchange of the bridge members 25 and holding units 30 are greatly facilitated.

In the intermittent feed device positioned in the holding unit 30, the electronic component web carrier 3 is fed through a passage having high-stage and low-stage portions. In the low-stage portion, the feed pins 307 are hooked in the openings 32 of the electronic component web carrier 3 to effect linear intermittent feeding. On the other hand, in the portion where the feed pins 307 are hung on the sprocket wheels 302 and 305, the electronic component web carrier 3 is guided to the elevated portion and separated from said feed pins. The movement of the feed pins 307 is therefore limited to intermittent movement in one direction, and wasteful strokes, such as in conventional feed claws drawing a rectangular locus, may be eliminated and the intermittent feeding may be accomplished at a high pitch.

Furthermore, the bridge members 25 are stacked and they are held and supported by the index cam 48 located at the lowermost end. The bridge members 25 are brought down pitch by pitch by the action of the index cam 48 and the force of gravity. Due to this arrangement, a particular mechanism such as, for example, a conveyor need not be provided for bringing down the bridge members 25. The structure may therefore be considerably simplified and problems and difficulties may be effectively prevented. Furthermore, maintenance and inspection is facilitated, and the lowering movement may be reliably accomplished, pitch by pitch, at high speed.

Another embodiment of the invention is described as follows, by reference to FIGS. 37 through 50. In the embodiment of FIGS. 37 to 50, a position adjusting device for adjusting the position of the separated piece 3a of the electronic component web carrier 3 is provided in the transfer device 24 of the aforedescribed embodiment. In the second embodiment of the invention, at the position where the electronic component is delivered to the chuck 15 of the transfer mechanism 9 as the subsequent step, the position of the separated piece 3a holding the electronic component 17 is precisely adjusted and set, whereby delivery of said electronic component to said chuck may be performed more reliably and smoothly.

In the following illustration of the second embodiment of the invention, the same components as in the first embodiment are represented by the same reference numerals, and descriptions of these components are omitted.

Figure 37:
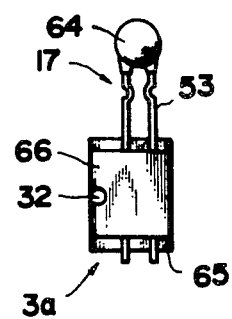
FIG. 37 is a front view of a cut electronic component separated from an electronic component web carrier.

In the second embodiment of the invention, as shown in FIG. 37, a predetermined electronic component 17 is cut and separated from the electronic component web carrier 3 by the cutter 317. The cut pieces of the support bands 65 and 66 are kept attached to the electronic component 17 with all, or up to about $\frac{3}{4}$, of the opening 37 being left without being cut off. The electronic component in the state shown in FIG. 37 is henceforth referred to as "separated piece 3a". The separated piece 3a is received by the bridge member 25 as the electronic component grip device moving in the transfer device 24, as in the first embodiment of the invention, and is held and gripped by said bridge member. The position of the separated piece 3a is adjusted at the predetermined delivery position in the lower portion of the transfer device 24. The separated piece 3a is then delivered to the chuck 15 of the transfer mechanism 9 as the subsequent step.

Any electronic components having parallel leads, such as, for example, flat ceramic condensers and cylindrical diodes, may be used as the electronic component 17 in the second embodiment of the invention, as in the first embodiment thereof.

The position adjusting device provided at the delivery position on the lowermost end of the descending guide comprises an opening center regulating device for regulating the center of the opening 32 left in the separated piece 3a, a direction regulating device for regulating the direction of the separated piece 3a in a horizontal plane and a lead press device for controlling the upward movement or rising of the leads 53 of the electronic component 17.

The opening center regulating device is first described with reference to FIGS. 38, 39, 40, 41 and 42. A lever 337 is rotatably supported by a pin 336 of a bracket 335. A positioning pin 338 having a sharp top end 338a is mounted at one end of the lever 337. The positioning pin 338 is arranged so that, as hereinafter described and illustrated in FIG. 45, when the lever 337 becomes horizontal at the delivery position, the position of said positioning pin comes into agreement with the normal position of the opening 32 of the separated piece 3a. The position of the opening 32 of the separated piece 3a is set by extending the positioning pin 338 through said opening. The other end of the lever 337 is connected to a rod 340 through a pin 339.

A bell crank 341 is connected to the rod 340 through a pin (not shown in the FIGS.). The bell crank 341 is rotatably supported by a pin 342 and has a cam roller 343 on the other end. The cam roller 343 is caused to move downward in contact with a cam 345 rotated by a shaft 344 through a spring 346 and is driven by rotation of said cam. The shaft 344 is driven by the main shaft 271 through bevel gears 280 and 347. Accordingly, the lever 337 is cooperative with the movement of the index cam 48, that is, with the movement of the bridge member 25. The lever 337 becomes horizontal just before the bridge member 25, holding the separated piece 3a, is brought down to the delivery position, and the positioning pin 338 meets the opening 32 at the predetermined position. If the position of the opening 32 disagrees with the position of the positioning pin 338, the position of said opening 32 is regulated with the sharp conical portion of the top end 338a as a guide. Furthermore, the chuck 15 is brought down before the separated piece 3a is drawn out, and the positioning pin 338 moves out of the opening 32.

Figure 40:
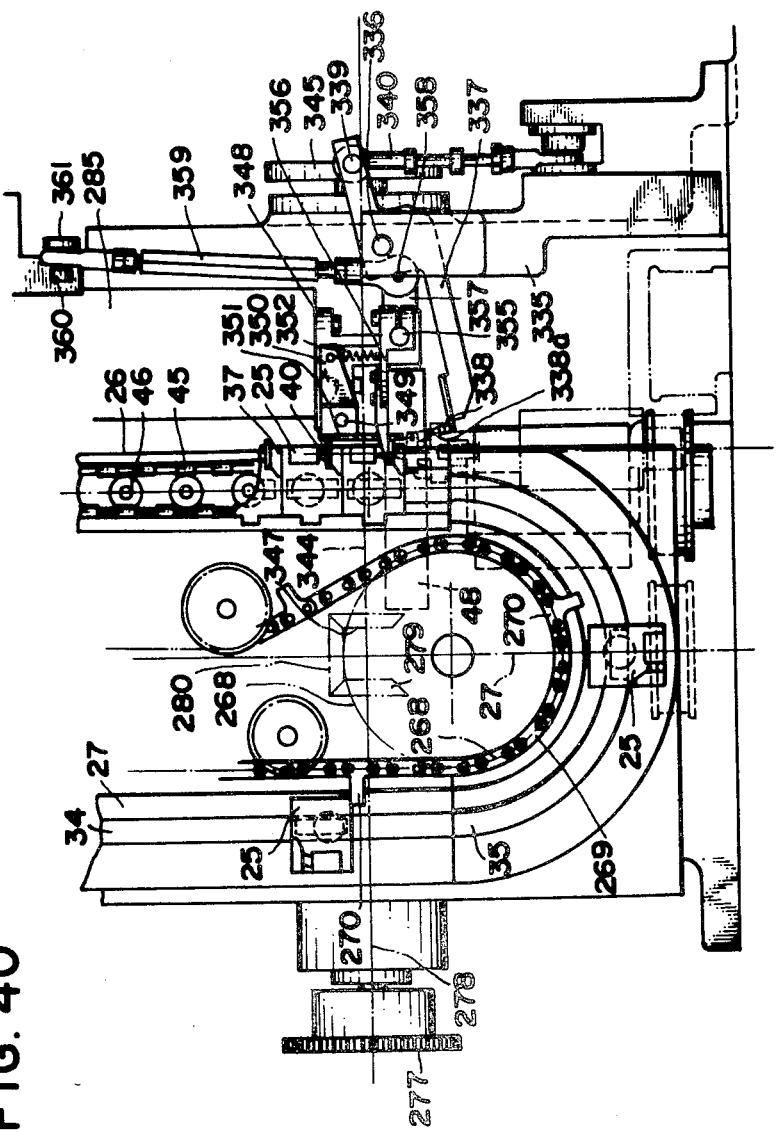
FIG. 40 is a front view, on an enlarged scale, of the embodiment of FIG. 38.
Figure 41:
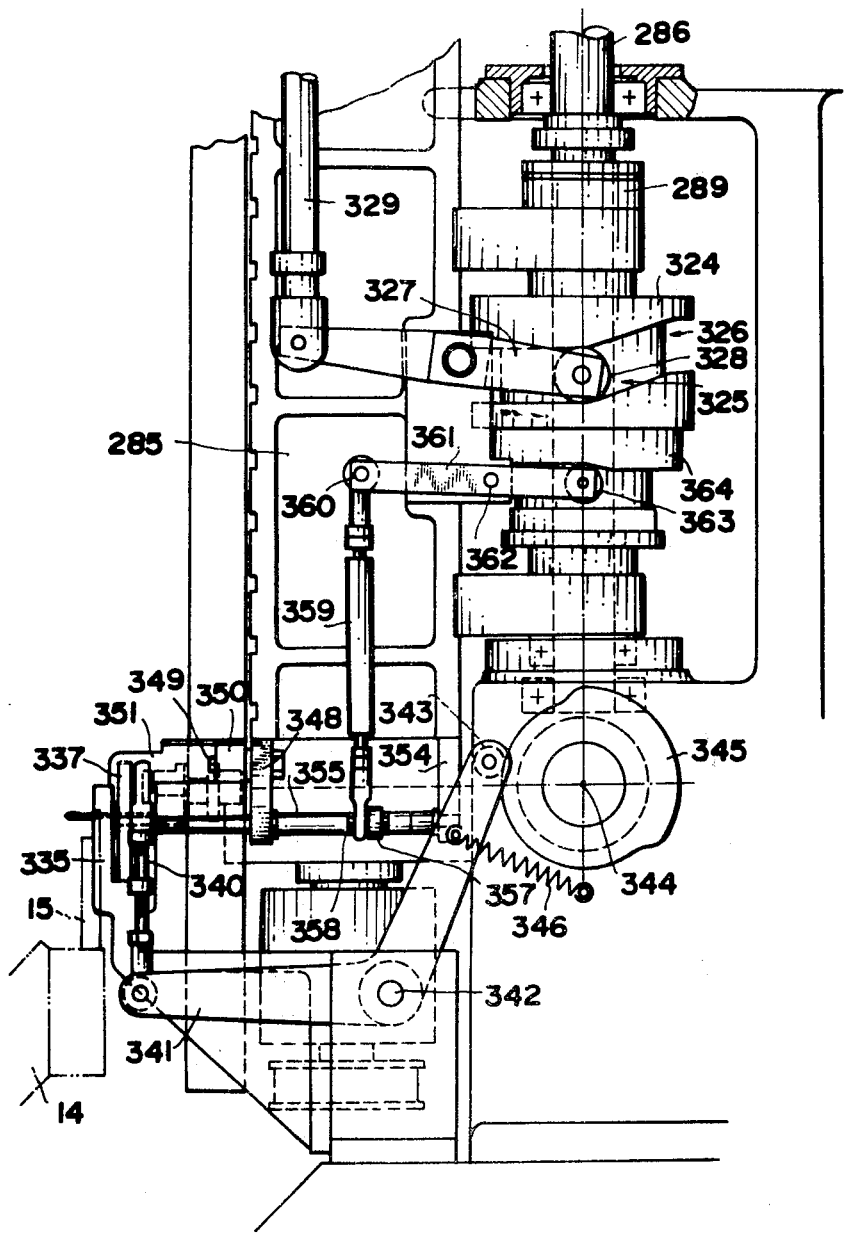
FIG. 41 is a side view, on an enlarged scale, of the lower part of the embodiment of FIG. 40.
Figure 42:
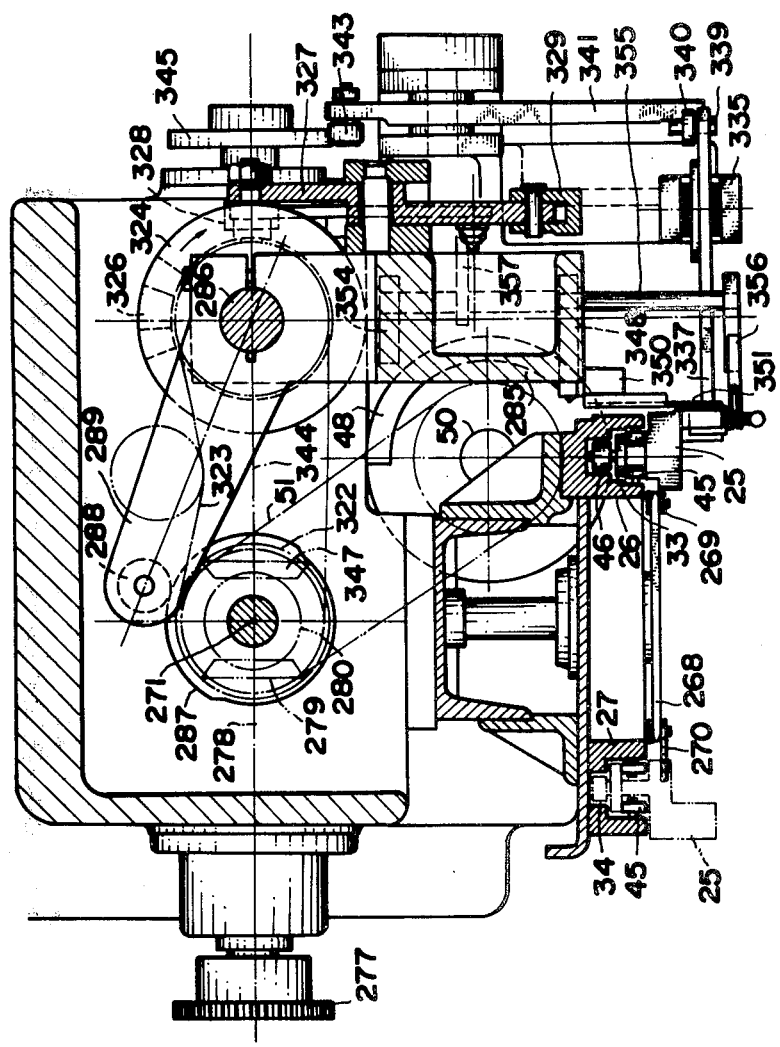
FIG. 42 is a view, on an enlarged scale and partly in section, taken along the lines 42—42, of FIG. 39.
Figure 47:
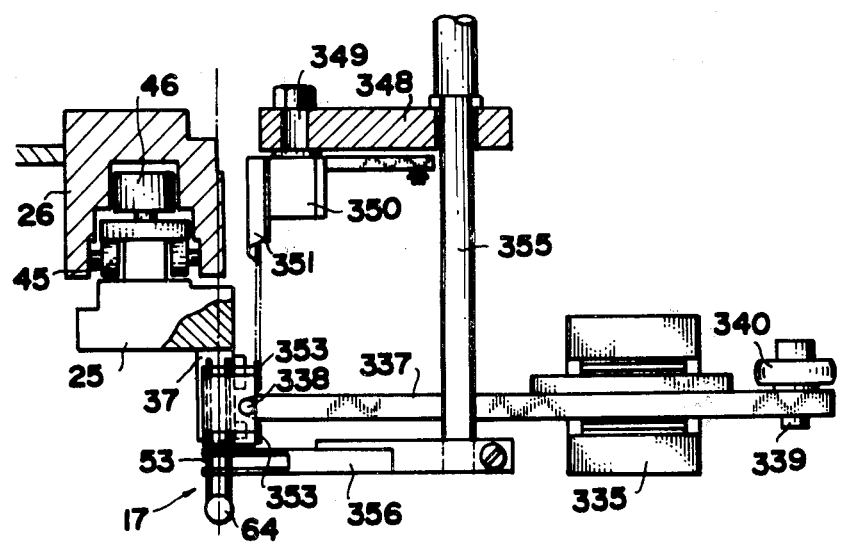
FIG. 47 is another plan view, partly in section, of the position adjusting device of FIG. 43, showing its operation sequence.
Figure 49:
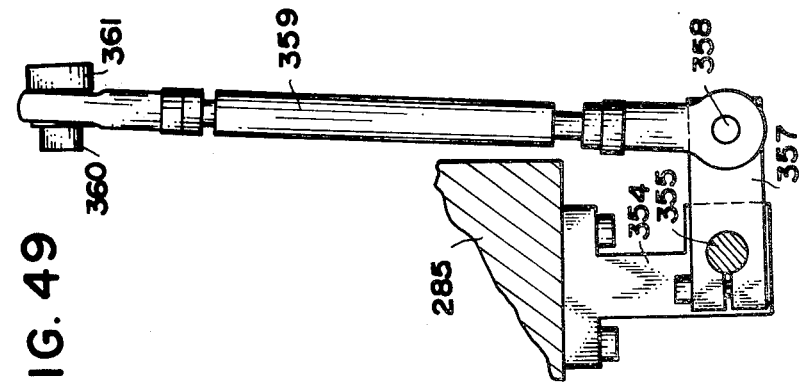
FIG. 49 is a view, partly in section, taken along the lines 49—49, of FIG. 48.
Figure 48:
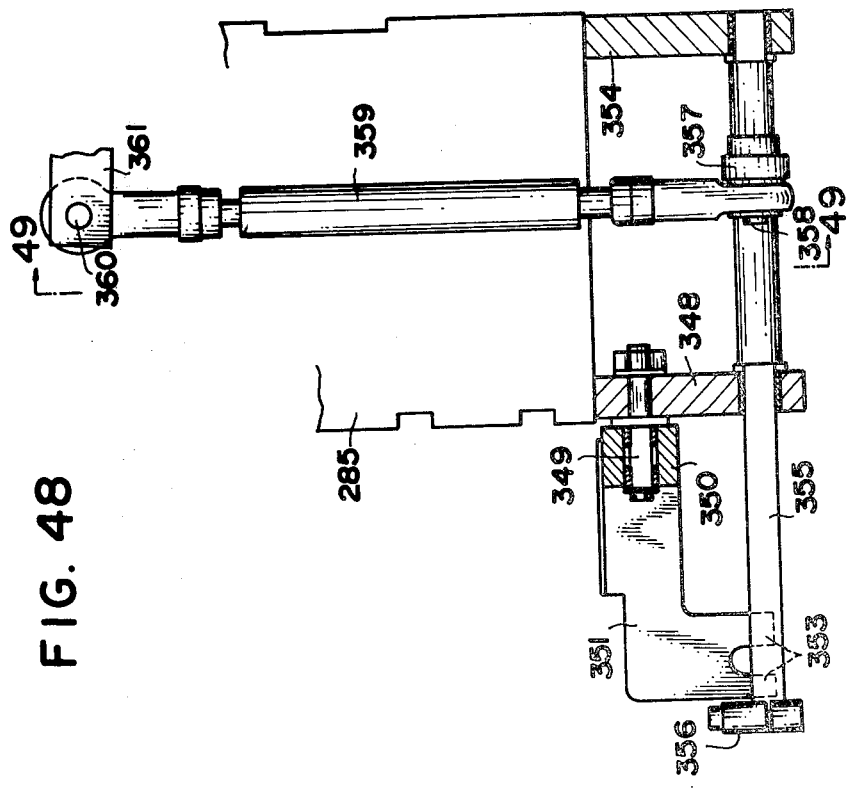
FIG. 48 is a view, partly in section, of the position adjusting device of FIG. 43.

The direction regulating device is described with reference to FIGS. 40, 41 and 42. A lever 350 is rotatably supported by a pin 349 on a bearing 348 mounted on the lower end of the post 285. A press plate 351 is mounted on the lever 350 and a spring 352 imparts a moment to said press plate, directed to the right in FIG. 40, around the pin 349. As hereinafter described and illustrated in FIG. 48, the press plate 351 has two pressing pieces 353 on the top end thereof. As shown in FIG. 47, after the center of the opening 32 is restrained by the positioning pin 338, both sides of the separated piece 3a are pressed by the pressing pieces 353 according to the displacement caused by the rotation of the post 285 to regulate the direction of said separated piece. The direction of the separated piece 3a is thus in agreement with the predetermined direction.

The lead press device is described with reference to FIGS. 40, 41 and 42. A press lever 356 is affixed to the top end of a shaft 355 rotatably supported by bearings 348 and 354. The top end of the press lever 356 is bifurcated. A lever 357 is affixed to part of the shaft 355 and a rod 359 is connected thereto via a pin 358. The top end of the rod 359 is connected to a lever 361 through a pin 360, and said lever is rotatably supported around a pin 362 and has a cam roller 363 on the other end. The lever 361 is driven by a lower cam face of a cam 364 rotating with the vertical shaft 286. When the press plate 351 presses the end edge of the separated piece 3a, the press lever 356 is simultaneously brought down to a horizontal position and presses the leads 53 of the electronic component 17 at the delivery position from above. The press lever 356 thereby prevents upward movement of the leads caused by contact with the chuck 15 when said chuck moves upward.

Figure 43:
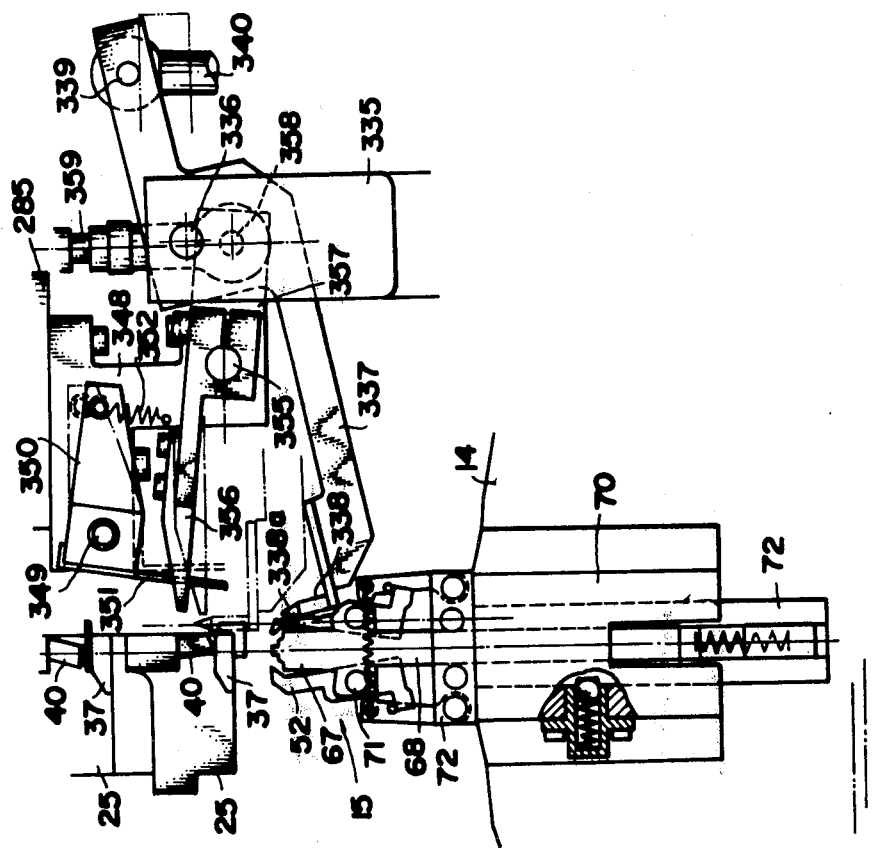
FIG. 43 is a front view showing the operation sequence of the position adjusting device of another embodiment of the automatic inserting machine of the invention.

The operation of the position adjusting device is described with reference to FIGS. 43, 44, 45, 46, 47, 48 and 49. FIG. 43 illustrates the state where the separated piece 3a of a specific bridge member 25 has been removed by the preceding chuck and said bridge member is going to be brought down by the action of the index cam 48. At this point, the subsequent chuck 15 has not reached the position just below the bridge member 25, but said chuck is illustrated at this position in the drawing for reference purposes.

At this point, the post 285 is at a position separate from the descending guide 26, and the press plate 351 is slightly sprung up by the spring 352, while the press lever 356 is slightly upwardly positioned. The lever 337 is brought down and the positioning pin 338 is released downwardly.

Figure 44:
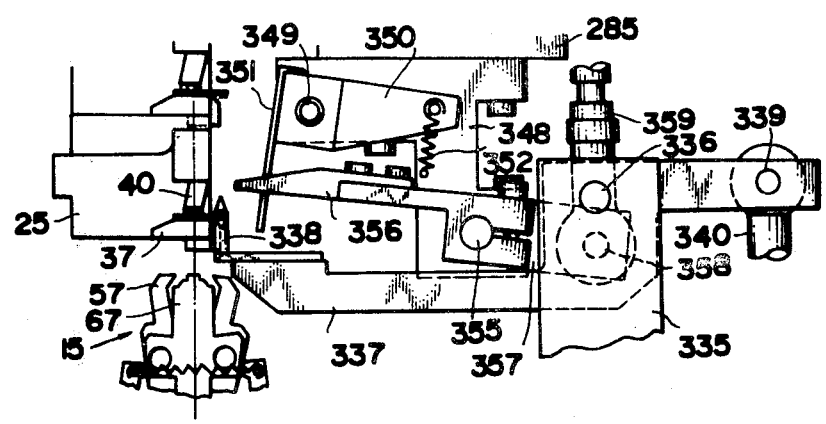
FIG. 44 is another front view of the position adjusting device of FIG. 43, showing its operation sequence.
Figure 45:
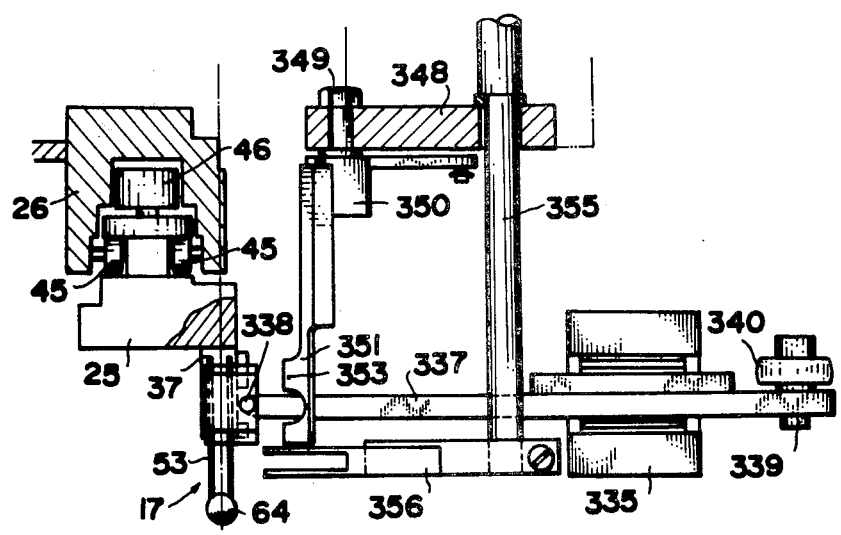
FIG. 45 is a plan view, partly in section, of the position adjusting device of FIG. 43, showing its operation sequence.
Figure 46:
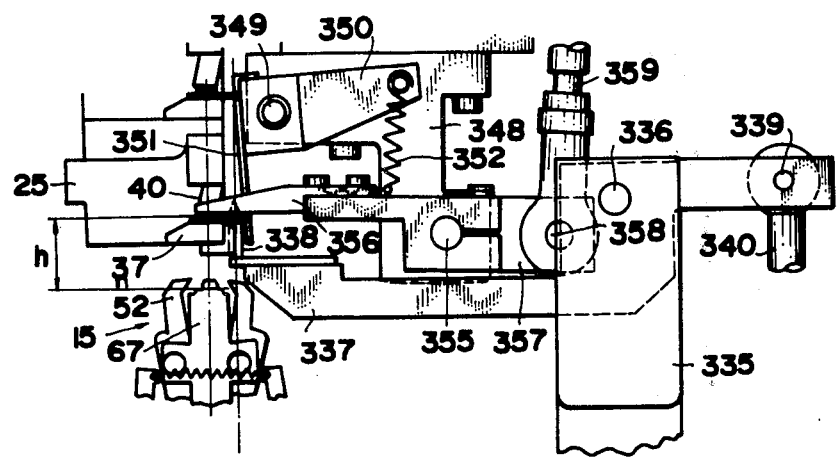
FIG. 46 is still another front view of the position adjusting device of FIG. 43, showing its operation sequence.
Figure 50:
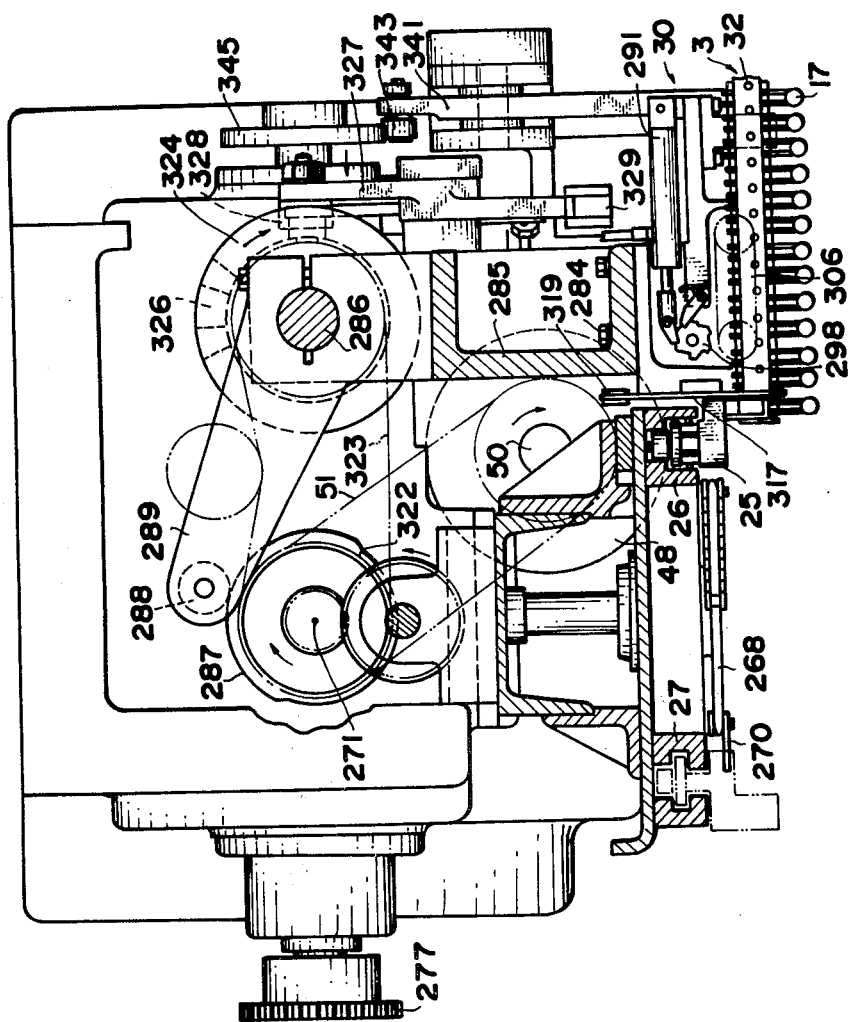
FIG. 50 is a view, partly in section, taken along the lines 50—50, of FIG. 39.

After the bridge member 25 has been brought down and while the subsequent bridge member is being brought down, the lever 337 is raised up to a horizontal position by the cam 345, whereby the positioning pin 338 is located at the predetermined position. When the bridge member 25 is then brought down to the delivery position, the opening 32 of the separated piece 3a is guided by the positioning pin 338 and the center of said opening is regulated to the predetermined position. This state is illustrated in FIGS. 44 and 45. Then, the post 285 is brought close to the descending guide 26 by the cam 287 (FIGS. 42 and 50). The pressing pieces 353 on the top end of the press plate 351 butt against the end edge of the separated piece 3a to press both sides of the positioning pin 338 as shown in FIGS. 46 and 47. This results in a reverse moment around the positioning pin 338 being imparted to the separated piece 3a. The separated piece 3a is thereby regulated to the predetermined direction. The press lever 356 is brought down to a horizontal position substantially simultaneously by the action of the cam 364 to press the leads 53 of the electronic component 17.

The chuck 15 is then elevated a height h by the action of the roller 89 (FIGS. 24 and 25) as in the first embodiment. This state is illustrated in FIG. 46. The leads 53 of the electronic component 17 are gripped and held between the movable claw 52 and the fixed claw 67. At this point, both the direction and position of the separated piece 3a holding the electronic component 17 are precisely regulated as predetermined. The leads 53 are pressed by the press lever 356 and the movable claw 52 and the fixed claw 67 of the chuck 15 grip said leads between two forks of said press lever. Accordingly, the leads 53 may be held and reliably gripped.

Just after the chuck 15 has gripped the leads 53, the positioning pin 338 is brought down and separated from said leads. The rotary disc 14 is then rotated and the chuck 15 is moved to carry out the separated piece 3a. Simultaneously, the post 285 is separated and the press lever 356 is raised up, and the state shown in FIG. 43 is restored. The aforedescribed cycle is repeated and in the second embodiment of the invention, the bridge member 25 is brought down by one stage of the holding unit 30 in every cycle.

In addition to the aforedescribed effects attained in the first embodiment of the invention, the following effect is provided by the second embodiment. Since the position adjusting device for adjusting the position of the separated piece 3a is disposed at the delivery position, said separated piece, that is, the electronic component 17, may be delivered more smoothly and reliably.

In accordance with the invention, as hereinbefore described, predetermined electronic components may be fed in a predetermined order from a variety of electronic component web carriers to the subsequent step such as, for example, the transfer mechanism, reliably and at high speed. Furthermore, since this operation is conducted while always restraining the leads of the electronic components, deformation of the leads or reduction of the precision of the distance or spacing, or the like, between the leads may be effectively prevented. Therefore, the automatic inserting machine of the invention is capable of performing the inserting operation very smoothly and with high reliability.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In a machine for processing and inserting parallel lead electronic components from electronic component web carriers into lead receiving openings in a printed circuit board, each electronic component web carrier having a front end, supply means for selectively receiving an electronic component at a first position and supplying said electronic component to a second predetermined position, said supply means including a supply sub-assembly having electronic component web carrier support means for supporting a plurality of electronic component web carriers at predetermined intervals, each electronic component web carrier having an upper side and a lower side, and said electronic component web carrier support means including upper and lower guides guiding the upper and lower sides of the electronic component web carrier, respectively, and a gap between said upper and lower guides forming a passage for the electronic component web carrier;

intermittent feed means for intermittently feeding each electronic component web carrier supported by said electronic component web carrier means, said intermittent feed means comprising a link pin having an end, an extension extending from the end of said link pin, a substantially vertical shaft, a pair of sprocket wheels rotatably mounted around said shaft, and a circulating chain mechanism having a feed chain supported by said sprocket wheels and including feed pins mounted at equal intervals on said extension from said link pin, said feed pins being substantially vertically positioned, the feed chain of said circulating chain mechanism being at a level and having a linear chain portion, each of said feed pins having an effective diameter portion with a top and at a specific level, said passage for the electronic component web carrier including a height-reduced passage portion in part of the linear chain portion of said circulating chain mechanism, said height-reduced passage portion being at a level lower than the level of the top end of the effective diameter portion of said feed pin, and the level of said feed chain of said circulating chain mechanism being higher than the level of said height-reduced passage portion and the level of said top end of said feed pin in a region where said feed chain is supported by said sprocket wheels;

electronic component grip means for receiving and gripping at said first position one component located on the front end of the electronic component web carrier fed by said intermittent feed means;

cutting means for separating the electronic component received and gripped by said electronic component grip means from the electronic component web carrier; and transfer means for moving said electronic component grip means gripping the electronic component separated by the cutting means to said second predetermined position.

2. In a machine for processing and inserting parallel lead electronic components from electronic component web carriers into lead receiving openings in a printed circuit board, each electronic component web carrier having a front end, supply means for selectively receiving an electronic component at a first position and supplying said electronic component to a second predetermined position, said supply means including a supply sub-assembly having electronic component web carrier support means for supporting a plurality of electronic component web carriers at predetermined intervals;

intermittent feed means for intermittently feeding each electronic component web carrier supported by said electronic component web carrier support means;

electronic component grip means for receiving and gripping at said first position one component located on the front end of the electronic component web carrier fed by said intermittent feed means, said electronic component grip means including a plurality of bridge members, each holding one of said electronic components;

cutting means for separating the electronic component received and gripped by said electronic component grip means from the electronic component web carrier; and transfer means for moving said electronic component grip means gripping the electronic component separated by the cutting means to said second predetermined position, said transfer means including intermittent stop means for stopping said electronic grip means at said second predetermined position for a predetermined period of time and then moving said electronic component grip means, and guide means for guiding the movement of said bridge members, said guide means including descending and ascending guides vertically positioned substantially parallel to each other, each of said guides having a lower end portion and an upper end portion, and a connecting guide for connecting the lower end portions and upper end portions of both said guides to each other, said descending guide being disposed contiguously to said electronic component web carrier support means.

3. A machine as claimed in claim 2, wherein said transfer means includes electronic component position adjusting means for adjusting the position of the electronic component gripped at said second predetermined position by said electronic component grip means.

4. A machine as claimed in claim 2, wherein each electronic component web carrier has an upper side and a lower side, and said electronic component web carrier support means includes upper and lower guides guiding the upper and lower sides of the electronic component web carrier, respectively, and a gap between said upper and lower guides forming a passage for the electronic component web carrier.

5. A machine as claimed in claim 2, wherein said electronic component web carrier support means includes detecting means for detecting the absence of a predetermined electronic component carried by the electronic web carrier.

6. A machine as claimed in claim 2, wherein said cutting means comprises a cutting mechanism including a plurality of cutter levers.

7. A machine as claimed in claim 2, wherein a plurality of said bridge members are stacked in said descending guide, the pitch of said stacked bridge members being equal to the pitch of the electronic component web carriers supported at said predetermined intervals by said electronic component web carrier support means, said stacked bridge members being held in said descending guide so that the position of the uppermost bridge member is at least as high as the position of the uppermost electronic component web carrier supported by said electronic component web carrier support means.

8. A machine as claimed in claim 2, wherein each of the plurality of bridge members of said electronic component grip means includes a grip stand and a grip claw.

9. A machine as claimed in claim 2, further comprising approaching and separating means for approaching and separating said electronic component web carrier support means reciprocatively to and from said transfer means, said approaching and separating means being positioned to approach and separate said electronic component web carrier support means according to the intermittent stop and movement of said electronic component grip means.

10. A machine as claimed in claim 2, further comprising driving means including a guiding circulating chain mechanism disposed contiguously to said ascending guide for providing a driving force for raising said bridge members along said ascending guide.

11. A machine as claimed in claim 4, wherein said intermittent feed means comprises a link pin having an end, an extension extending from the end of said link pin, a substantially vertical shaft, a pair of sprocket wheels rotatably mounted around said shaft, and a circulating chain mechanism having a feed chain supported by said sprocket wheels and including feed pins mounted at equal intervals on said extension from said link pin, said feed pins being substantially vertically positioned.

12. A machine as claimed in claim 6, wherein said cutting means further comprises an operation rod connected in common to said cutter levers for simultaneously operating said cutter levers.

13. A machine as claimed in claim 8, further comprising a horizontal claw fulcrum pin and a spring affixed to said grip claw, and wherein said grip claw is rotatably mounted around the horizontal claw fulcrum pin, said grip stand having a surface, said spring causing said grip claw to obliquely butt the surface of said grip stand so that resistance to the movement of the electronic component in a normal receiving direction is slight and resistance to the movement of the electronic component in the reverse direction is great.

14. A machine as claimed in claim 11, wherein said intermittent feed means further comprises a reciprocatively moving cylinder mechanism and ratchet means coupling one of said sprocket wheels to said cylinder mechanism whereby said sprocket wheel is intermittently rotated in one direction by repetition of the reciprocative movement of said cylinder mechanism.

15. A machine as claimed in claim 12, wherein said cutting means further comprises interlocking means for driving said operation rod cooperatively with said intermittent stop means in a manner whereby cutting by said cutter levers is performed during a period when said electronic component grip means is stopped before initiation of the movement thereof and during a period in which said electronic component web carrier support means approaches said transfer means before initiation of the separation therefrom.

16. In a machine for processing and inserting parallel lead electronic components from electronic component web carriers into lead receiving openings in a printed circuit board, each electronic component web carrier having a front end, supply means for selectively receiving an electronic component at a first position and supplying said electronic component to a second predetermined position, said supply means including a supply sub-assembly having

- electronic component web carrier support means for supporting a plurality of electronic component web carriers at predetermined intervals;
- intermittent feed means for intermittently feeding each electronic component web carrier supported by said electronic component web carrier support means;
- electronic component grip means for receiving and gripping at said first position one component located on the front end of the electronic component web carrier fed by said intermittent feed means, said electronic component grip means including a substantially horizontal shaft;
- cutting means for separating the electronic component received and gripped by said electronic component grip means from the electronic component web carrier; and
- transfer means for moving said electronic component grip means gripping the electronic component separated by the cutting means to said second predetermined position, said transfer means including intermittent stop means for stopping said electronic component grip means at said second predetermined position for a predetermined period of time and then moving said electronic component grip means, said intermittent stop means comprising a substantially vertical shaft, a disc-shaped barrel cam rotatably mounted around said vertical shaft, a cam roller rotatably mounted on the substantially horizontal shaft of said electronic component grip means, said barrel cam having a top face with a peripheral edge therearound and a roller turning passage formed in said top face of said barrel cam in the vicinity of the peripheral edge thereof, said roller turning passage being horizontal in a predetermined range of a central angle in one part thereof and having an inclined face gradually descending in a predetermined substantially circular direction in another portion thereof, said roller turning passage receiving said cam roller mounted on said electronic component grip means.

* * * * *